US010672782B2

(12) United States Patent
Utsumi

(10) Patent No.: US 10,672,782 B2
(45) Date of Patent: *Jun. 2, 2020

(54) SEMICONDUCTOR MEMORY DEVICE

(71) Applicant: Toshiba Memory Corporation, Minato-ku (JP)

(72) Inventor: Tetsuaki Utsumi, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/397,052

(22) Filed: Apr. 29, 2019

(65) Prior Publication Data
US 2019/0252398 A1 Aug. 15, 2019

Related U.S. Application Data

(63) Continuation of application No. 15/646,780, filed on Jul. 11, 2017, now Pat. No. 10,276,585.

(30) Foreign Application Priority Data

Jan. 31, 2017 (JP) ................................. 2017-016330

(51) Int. Cl.
*H01L 27/11568* (2017.01)
*H01L 27/11582* (2017.01)
(Continued)

(52) U.S. Cl.
CPC .......... *H01L 27/11568* (2013.01); *G11C 5/04* (2013.01); *G11C 29/022* (2013.01);
(Continued)

(58) Field of Classification Search
CPC ......... H01L 27/11568; H01L 27/11578; H01L 27/11575; H01L 27/11573;
(Continued)

(56) References Cited

U.S. PATENT DOCUMENTS 7,910,432 B2 3/2011 Tanaka
8,350,314 B2 1/2013 Fukuzumi
(Continued)

FOREIGN PATENT DOCUMENTS

JP H10-4125 A 1/1998
JP 2007-266143 10/2007
(Continued)

*Primary Examiner* — Michael M Trinh
(74) *Attorney, Agent, or Firm* — Oblon, McClelland, Maier & Neustadt, L.L.P.

(57) ABSTRACT

A semiconductor memory device includes a semiconductor substrate, transistors formed in an upper surface of the semiconductor substrate, a stacked body provided on the semiconductor substrate, a first contact, and a second contact. The transistors are arranged along a first direction. A minimum period of an arrangement of the transistors is a first period. The stacked body includes electrode films. A configuration of a first portion of the stacked body is a staircase-like having terraces. A first region and a second region are set along the first direction in the first portion. A length in the first direction of the terrace disposed in the second region is longer than the first period. A length in the first direction of the terrace disposed in the first region is shorter than the first period.

16 Claims, 33 Drawing Sheets

Related U.S. Application Data

(60) Provisional application No. 62/374,034, filed on Aug. 12, 2016.

(51) Int. Cl.

| | | |
|---|---|---|
| *H01L 25/065* | (2006.01) | |
| *G11C 5/04* | (2006.01) | |
| *H01L 23/00* | (2006.01) | |
| *H01L 29/792* | (2006.01) | |
| *H01L 27/11578* | (2017.01) | |
| *H01L 21/822* | (2006.01) | |
| *H01L 21/28* | (2006.01) | |
| *G11C 29/02* | (2006.01) | |
| *H01L 27/11573* | (2017.01) | |
| *H01L 27/11575* | (2017.01) | |
| *G11C 29/04* | (2006.01) | |

(52) U.S. Cl.
CPC .......... *G11C 29/023* (2013.01); *G11C 29/028* (2013.01); *H01L 21/8221* (2013.01); *H01L 24/16* (2013.01); *H01L 25/0657* (2013.01); *H01L 27/11573* (2013.01); *H01L 27/11575* (2013.01); *H01L 27/11578* (2013.01); *H01L 27/11582* (2013.01); *H01L 29/40117* (2019.08); *H01L 29/792* (2013.01); *G11C 2029/0409* (2013.01); *H01L 2224/16145* (2013.01); *H01L 2225/06517* (2013.01)

(58) Field of Classification Search
CPC ......... H01L 27/11582; H01L 27/11521; H01L 27/11524; H01L 27/11529; H01L 27/11565; H01L 27/1157; H01L 27/11556; H01L 25/0657; H01L 25/50; H01L 2225/06513; H01L 2225/06517; H01L 2224/16145; H01L 2224/16225; H01L 2224/16146; H01L 2224/16147; H01L 2224/16148; H01L 21/8221; H01L 29/40117; H01L 29/792; H01L 29/7926; H01L 29/41741

See application file for complete search history.

(56) References Cited

U.S. PATENT DOCUMENTS

| | | | |
|---|---|---|---|
| 8,592,890 B2 | 11/2013 | Watanabe et al. | |
| 8,969,945 B2 | 3/2015 | Kito et al. | |
| 9,455,268 B2* | 9/2016 | Oh | H01L 27/2481 |
| 10,276,585 B2* | 4/2019 | Utsumi | H01L 29/792 |
| 2007/0252201 A1* | 11/2007 | Kito | H01L 21/8221 |
| | | | 257/331 |
| 2009/0267135 A1 | 10/2009 | Tanaka | |
| 2010/0039865 A1* | 2/2010 | Kidoh | H01L 21/8221 |
| | | | 365/185.23 |
| 2010/0090286 A1* | 4/2010 | Lee | H01L 27/11526 |
| | | | 257/368 |
| 2010/0207186 A1 | 8/2010 | Higashi et al. | |
| 2011/0019480 A1* | 1/2011 | Kito | H01L 27/11565 |
| | | | 365/185.18 |
| 2011/0092038 A1* | 4/2011 | Choi | H01L 27/11526 |
| | | | 438/268 |
| 2011/0284946 A1 | 11/2011 | Kiyotoshi | |
| 2014/0061766 A1 | 3/2014 | Kito et al. | |
| 2016/0079164 A1* | 3/2016 | Fukuzumi | H01L 27/11582 |
| | | | 257/324 |
| 2017/0092680 A1* | 3/2017 | Kwon | H01L 27/11582 |
| 2017/0287833 A1 | 10/2017 | Thimmegowda et al. | |

FOREIGN PATENT DOCUMENTS

| | | |
|---|---|---|
| JP | 2011-142276 A | 7/2011 |
| JP | 2012-119478 A | 6/2012 |
| JP | 2014-53605 | 3/2014 |
| JP | 2015-526910 A | 9/2015 |
| JP | 2015-230909 | 12/2015 |
| JP | 2016-62901 A | 4/2016 |
| TW | 200901391 A1 | 1/2009 |
| TW | 201005954 A1 | 2/2010 |
| TW | 201032326 A1 | 9/2010 |
| TW | 201436129 A1 | 9/2014 |

* cited by examiner

SEMICONDUCTOR MEMORY DEVICE

CROSS-REFERENCE TO RELATED APPLICATIONS

This application is a continuation of U.S. application Ser. No. 15/646,780, filed Jul. 11, 2017, which is based upon and claims the benefit of priority from U.S. Provisional Patent Application 62/374,034, filed on Aug. 12, 2016; the entire contents of which are incorporated herein by reference.

This application is based upon and claims the benefit of priority from Japanese Patent Application No. 2017-016330, filed on Jan. 31, 2017; the entire contents of which are incorporated herein by reference.

FIELD

Embodiments relate to a semiconductor memory device.

BACKGROUND

In recent years, a stacked semiconductor memory device has been proposed in which memory cells are integrated three-dimensionally. In such a stacked semiconductor memory device, a stacked body in which electrode films and insulating films are stacked alternately is provided on the semiconductor substrate; and semiconductor pillars that pierce the stacked body are provided. Thereby, memory cell transistors are formed at each crossing portion between the electrode films and the semiconductor pillars. On the other hand, transistors that switch between whether or not potentials are supplied to the electrode films are provided at the periphery of the stacked body. The end portion of the stacked body is patterned into a staircase configuration; a contact is connected to each of the electrode films; and the contacts are connected to the transistors via upper layer interconnects. In such a semiconductor memory device, when the number of stacks of electrode films increases, the number of upper layer interconnects increases; and it becomes difficult to make the layout.

DETAILED DESCRIPTION

A semiconductor memory device according to an embodiment includes a semiconductor substrate, a plurality of transistors formed in an upper surface of the semiconductor substrate, a stacked body provided on the semiconductor substrate, a semiconductor member, a charge storage member a first contact, a second contact, and a first interconnect provided on the first contact and the second contact, and connected between the first contact and the second contact. The plurality of transistors is arranged periodically along a first direction parallel to the upper surface. A minimum period of the plurality of transistors is a first period. The stacked body includes a plurality of electrode films stacked to be separated from each other along a vertical direction. The semiconductor member pierces the plurality of electrode films. The charge storage member is provided between the semiconductor member and one of the plurality of electrode films. A configuration of a first portion of the stacked body is a staircase-like having a plurality of terraces. The first portion is disposed in the region directly above the plurality of transistors. Each of the plurality of terraces is formed each of the electrode films. The plurality of terraces includes a plurality of first terraces and a second terrace. A second region and two first regions are set along the first direction in the first portion. The second region is disposed between the two first regions. The plurality of first terraces is disposed in each of the first regions. The second terrace is disposed in the second region. A length in the first direction of the second terrace is longer than the first period. A length in the first direction of one of the plurality of first terraces is shorter than the first period. A lower end of the first contact is connected to one of the plurality of electrode films at one of the terraces. The second contact pierces the stacked body. A lower end of the second contact is connected to one of a source/drain of the transistor.

(First Embodiment)

First, a first embodiment will be described.

Figure 1:
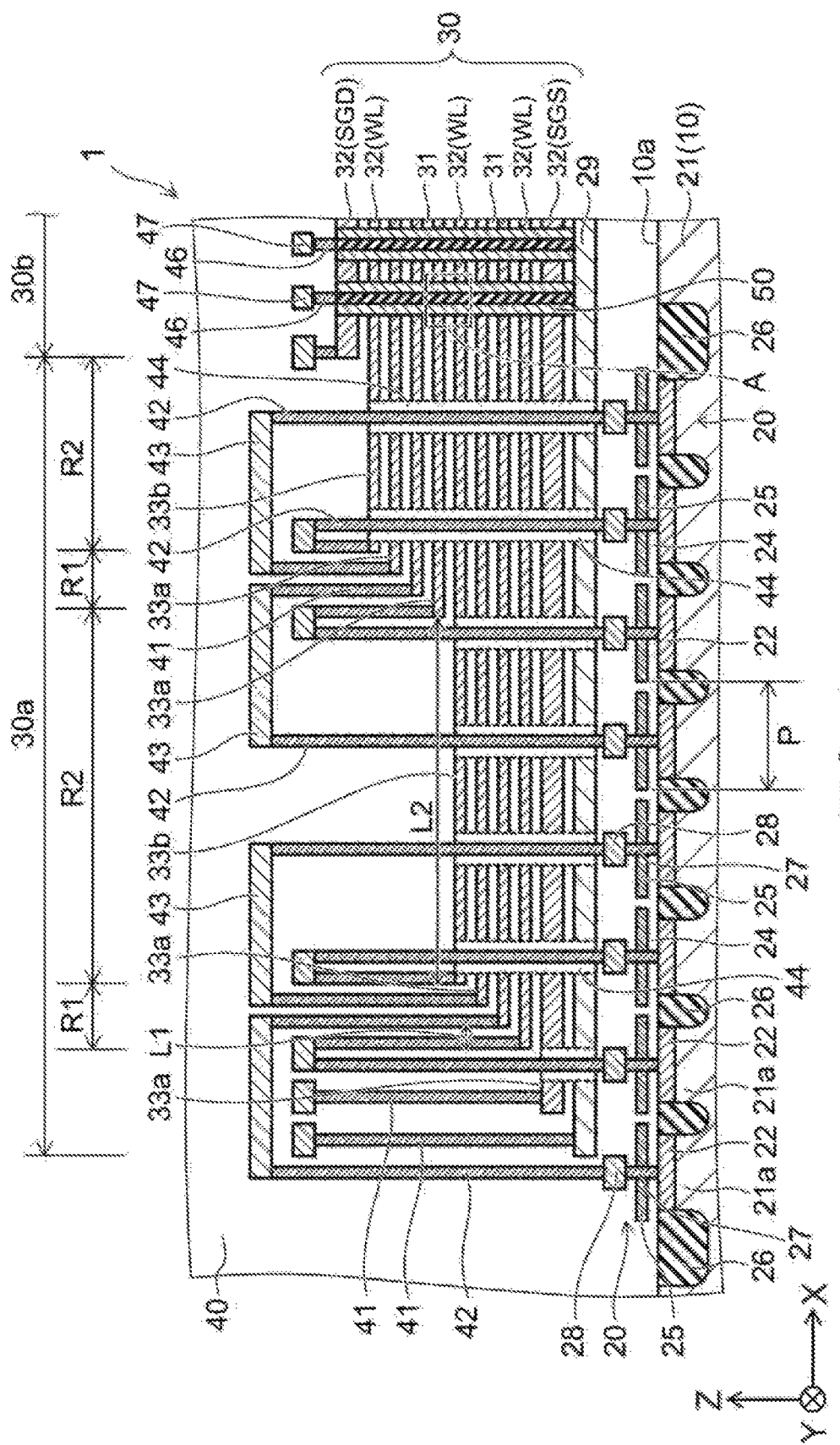
FIG. 1 is a cross-sectional view showing a semiconductor memory device according to a first embodiment.

FIG. 1 is a cross-sectional view showing a semiconductor memory device according to the embodiment.

Figure 2:
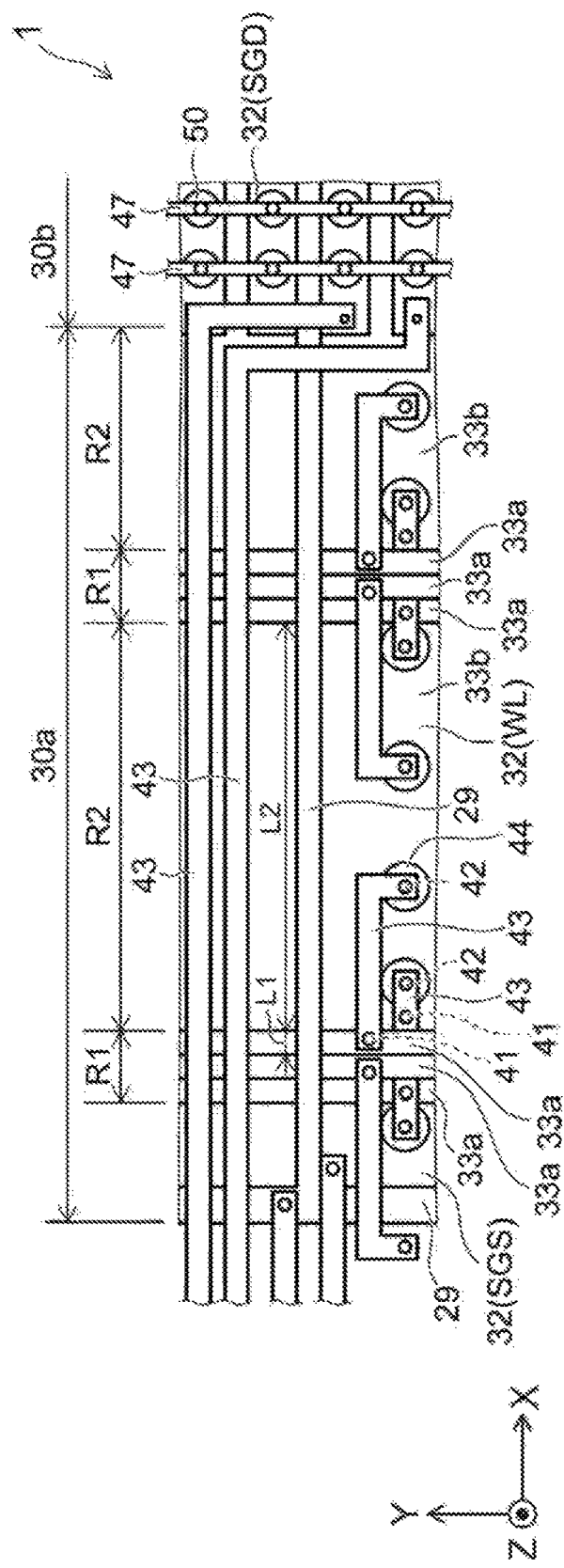
FIG. 2 is a plan view showing an interconnect portion of the semiconductor memory device according to the first embodiment.

FIG. 2 is a plan view showing the interconnect portion of the semiconductor memory device according to the embodiment.

Figure 3:
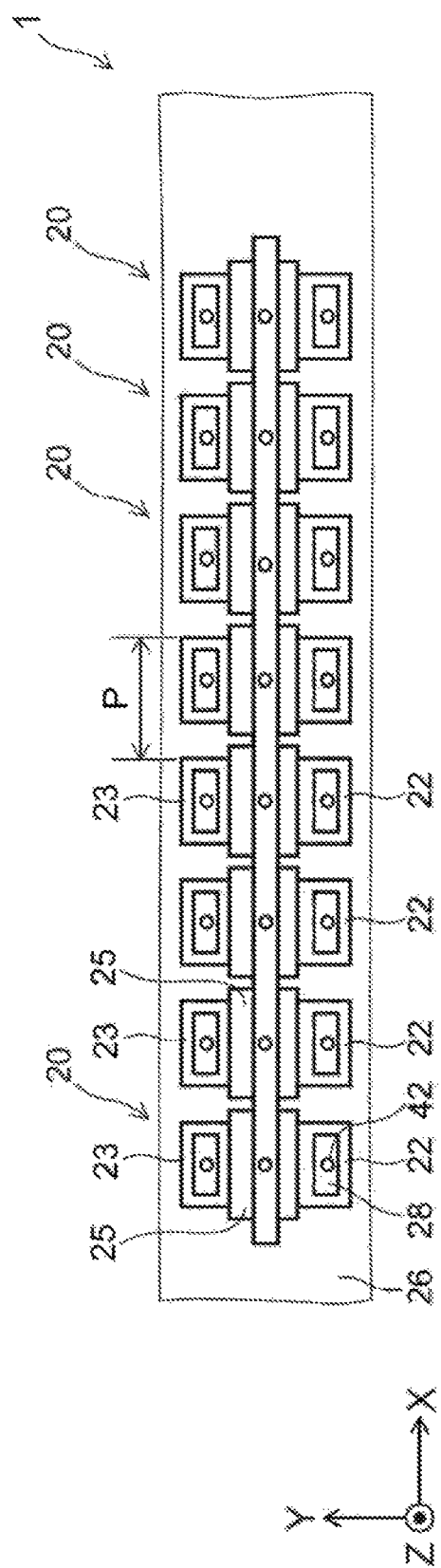
FIG. 3 is a plan view showing a substrate surface of the semiconductor memory device according to the first embodiment.

FIG. 3 is a plan view showing the substrate surface of the semiconductor memory device according to the embodiment.

Figure 4:
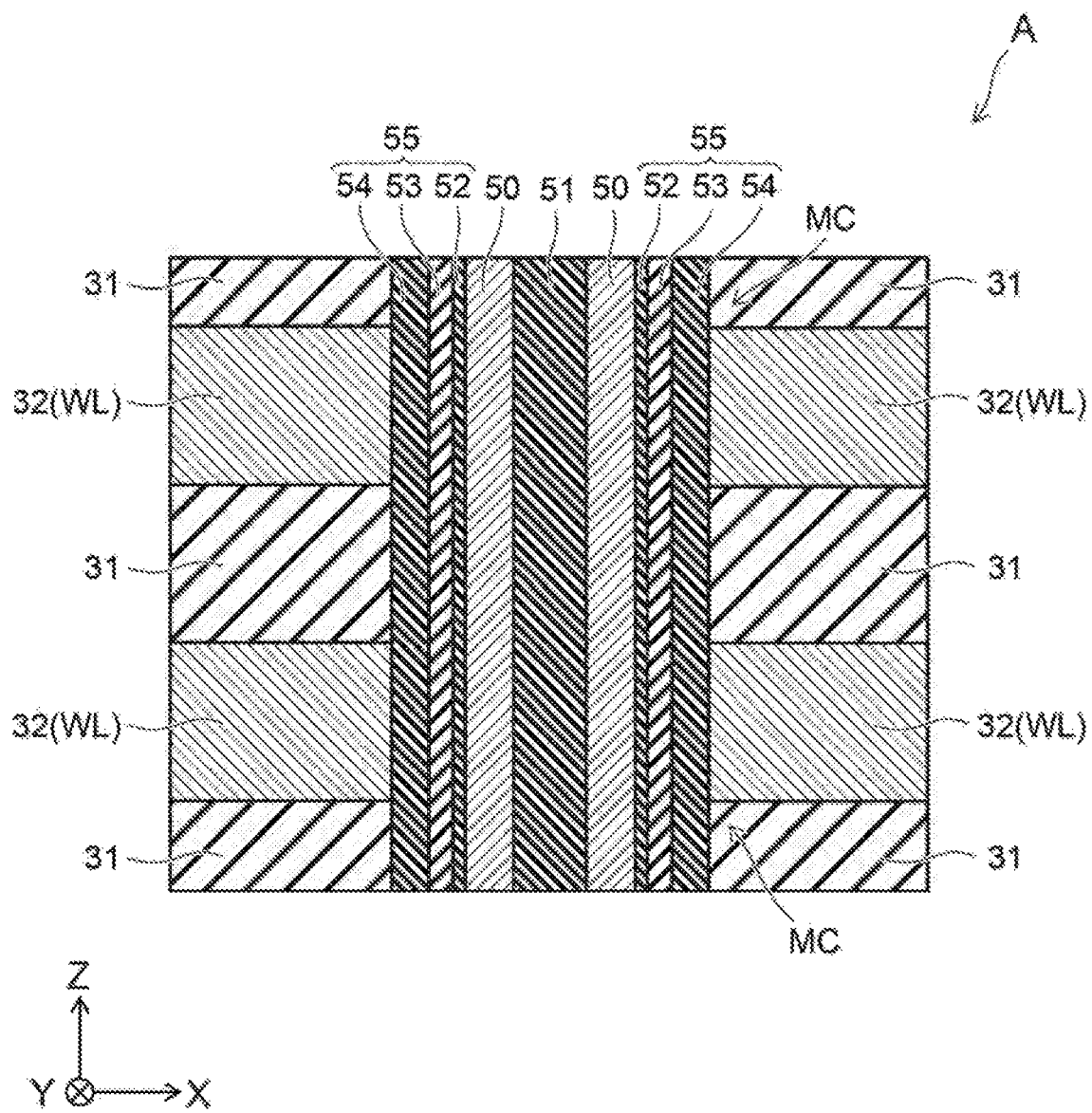
FIG. 4 is a partially enlarged cross-sectional view showing region A of FIG. 1.

FIG. 4 is a partially enlarged cross-sectional view showing region A of FIG. 1.

The semiconductor memory device according to the embodiment is, for example, a nonvolatile semiconductor memory device and is, for example, stacked NAND flash memory.

As shown in FIG. 1 to FIG. 3, a semiconductor substrate 10 is provided in the semiconductor memory device 1 according to the embodiment. In the specification hereinbelow, an XYZ orthogonal coordinate system is employed for convenience of description. Two mutually-orthogonal directions parallel to an upper surface 10a of the semiconductor substrate 10 are taken as an "X-direction" and a "Y-direction;" and a direction perpendicular to the upper surface of the semiconductor substrate 10 is taken as a "Z-direction." Also, although a direction that is in the Z-direction from the semiconductor substrate 10 toward a stacked body 30 described below is called "up" and the reverse direction is called "down," these expressions are for convenience and are independent of the direction of gravity.

The semiconductor substrate 10 is formed of, for example, a monocrystal of silicon. For example, a p-type well 21 is formed in a portion of the upper layer portion of the semiconductor substrate 10. STI (Shallow Trench Isolation) 26 is provided in a lattice configuration in a portion of the upper layer portion of the well 21 and partitions the upper layer portion of the well 21 into multiple body regions 21a. The body regions 21a are arranged in a matrix configuration along the X-direction and the Y-direction. A field effect transistor 20 is provided in the upper surface of each of the body regions 21a, that is, in the region of the upper surface 10a of the semiconductor substrate 10 surrounded with the STI 26. N-type diffusion regions 22 and 23 are formed to be separated from each other in the upper portions of the two Y-direction end portions of each of the body regions 21a. The diffusion regions 22 and 23 are source/drain regions of the transistor 20. Also, a gate insulating film 24 is provided on the well 21; and a gate electrode 25 is provided on the gate insulating film 24.

The arrangement period of the transistors 20 in the X-direction is substantially constant. More specifically, multiple transistors 20 are provided inside a prescribed region of the upper surface 10a of the semiconductor substrate 10; and inside this region, the arrangement period of the transistors 20 in the X-direction is constant. In the specification, this arrangement period is called the "minimum arrangement period." Although only one of these regions is shown in the embodiment, there are also cases where this region is multiply provided as in a ninth embodiment described below. In such a case, the distance between the mutually-adjacent regions is larger than the spacing between the transistors 20 determined by the minimum arrangement period. The arrangement period of the transistors 20 is, for example, an arrangement period of the end edges facing one side in the X direction of the body region 21a.

Contacts 27, lower layer interconnects 28, and a source line 29 are provided, from the bottom toward the top, on the semiconductor substrate 10, i.e., on the transistors 20. The lower layer interconnects 28 are multiply provided and may be connected to each other by via contacts. The lower end of the contact 27 is connected to the diffusion region 22; and the upper end of the contact 27 is connected to the lower layer interconnect 28. The source line 29 is provided on the lower layer interconnects 28; and the configuration of the source line 29 is a plate configuration spreading along the XY plane.

The stacked body 30 is provided on the source line 29. The insulating films 31 and electrode films 32 are stacked alternately along the Z-direction in the stacked body 30. The insulating films 31 are formed of, for example, an insulating material such as silicon oxide (SiO), etc.; and the electrode films 32 are formed of, for example, a conductive material such as tungsten (W), polysilicon (Si) to which an impurity is introduced, etc. The transistors 20 are transistors for driving the electrode films 32. Other than the transistors 20, for example, transistors that are included in a peripheral circuit (not illustrated) may be provided in the semiconductor memory device 1.

As shown in FIG. 2, the electrode films 32 are subdivided into multiple band-like portions arranged along the Y-direction. Each of the band-like portions extends in the X-direction. In the embodiment, the band-like portions of the electrode film 32 of the lowermost layer function as source-side selection gates SGS; the band-like portions of the electrode film 32 of the uppermost layer function as drain-side selection gates SGD; and the band-like portions of the other electrode films 32 function as word lines WL. The band-like portions of the electrode films 32 of multiple layers from the lowermost layer may function as the source-side selection gates SGS; and the band-like portions of the electrode films 32 of multiple layers from the uppermost layer may function as the drain-side selection gates SGD. The arrangement period of the drain-side selection gates SGD in the Y-direction is half of the arrangement period of the source-side selection gates SGS and the word lines WL. In other words, two drain-side selection gates SGD are disposed in the region directly above one word line WL. One, three, or more drain-side selection gates SGD may be disposed in the region directly under one word line WL.

The configuration of an end portion 30a in the X-direction of the stacked body 30 is a staircase-like in which a terrace is formed every electrode film 32. The terrace is the upper surface of the X-direction end portion of the electrode film 32. The electrode films 32 of the layers above a terrace are not disposed in the region directly above the terrace. The end portion 30a is disposed in the region directly above the transistors 20. On the other hand, a central portion 30b in the X-direction of the stacked body 30 is not disposed in the region directly above the transistors 20.

The upper surface of the end portion 30a descends, in stages and without increasing partway, along the direction from the X-direction central portion 30b toward the end portion 30a of the stacked body 30. However, the descent is not periodic. Specifically, regions R1 and regions R2 are arranged alternately along the X-direction in the end portion 30a. In the region R1, multiple terraces 33a that have narrow widths are arranged along the X-direction. On the other hand, in the region R2, one terrace 33b that has a wide width is disposed. A length L2 of the terrace 33b in the X-direction is longer than a length L1 of the terrace 33a in the X-direction. Also, in the X-direction, the length L1 of the terrace 33a is shorter than a minimum arrangement period P of the transistors 20; and the length L2 of the terrace 33b is longer than the minimum arrangement period P of the transistors 20. In other words, L1<P<L2.

An insulating film 40 is provided on the semiconductor substrate 10 to cover the stacked body 30. Multiple contacts 41 and multiple contacts 42 are provided inside the insulating film 40. Upper layer word lines 43 are connected respectively between the upper ends of the contacts 41 and the upper ends of the contacts 42. The upper layer word lines 43 are disposed higher than the stacked body 30 inside the insulating film 40.

The contacts 41 extend in the Z-direction; and the lower ends of the contacts 41 are connected to the electrode films 32 at the terraces 33a or the terraces 33b. Accordingly, among the electrode films 32, the electrode films 32 that have the terraces 33a inside the region R1 are connected to the contacts 41 inside the region R1. On the other hand, the electrode films 32 that have the terraces 33b inside the region R2 are connected to the contacts 41 inside the region R2. Therefore, the contacts 41 are disposed in both the region R1 and the region R2.

The contacts 42 are disposed inside the region R2. The contacts 42 extend in the Z-direction and pierce the source line 29 and the end portion 30a of the stacked body 30. The lower ends of the contacts 42 are connected to the lower layer interconnects 28. An insulating film 44 is provided at the peripheries of the contacts 42. The contacts 42 are insulated from the electrode films 32 and the source line 29 by the insulating film 44.

Thus, each of the electrode films 32 is connected to the diffusion region 22 of the transistor 20 via the contact 41, the upper layer word line 43, the contact 42, the lower layer interconnect 28, and the contact 27. Also, the electrode films 32 that have the terraces 33a inside the region R1 are connected to the diffusion regions 22 via the contacts 41 inside the region R1 and the contacts 42 inside the region R2. The electrode films 32 that have the terraces 33b inside the region R2 are connected to the diffusion regions 22 via the contacts 41 inside the region R2 and the contacts 42 inside the region R2.

On the other hand, silicon pillars 50 that extend in the Z-direction are provided inside the central portion 30b of the stacked body 30. The silicon pillars 50 are made of, for example, polysilicon; and the configurations of the silicon pillars 50 are circular tubes having plugged lower ends. The lower ends of the silicon pillars 50 are connected to the source line 29. The upper ends of the silicon pillars 50 are connected to bit lines 47 by via contacts 46. The bit lines 47 are disposed on the central portion 30b of the stacked body 30 and extend in the Y-direction. A structure (not shown) similar to the silicon pillar 50 is also provided in the end portion 30a of the stacked body 30. This structure is not connected to the bit line 47 and does not function electrically. This structure functions as a support column for supporting the stacked body 30 in the manufacturing process of the semiconductor memory device 1.

As shown in FIG. 4, a core member 51 that is made of, for example, silicon oxide is provided inside the silicon pillar 50. The core member 51 may not be provided. A tunneling insulating film 52 is provided on the side surface of the silicon pillar 50. Although the tunneling insulating film 52 normally is insulative, the tunneling insulating film 52 is a film in which a tunneling current flows when a prescribed voltage within the range of the drive voltage of the semiconductor memory device 1 is applied. The tunneling insulating film 52 includes, for example, a single-layer silicon layer, or an ONO film in which a silicon oxide layer, a silicon nitride layer, and a silicon oxide layer are stacked in this order.

A charge storage film 53 is provided on the surface of the tunneling insulating film 52. The charge storage film 53 is a film that can store charge, is formed of, for example, a material having trap sites of electrons, and is formed of, for example, silicon nitride (SiN).

A blocking insulating film 54 is provided on the surface of the charge storage film 53. The blocking insulating film 54 is a film in which a current substantially does not flow even when a voltage within the range of the drive voltage of the semiconductor memory device 1 is applied. The blocking insulating film 54 is, for example, a two-layer film in which a silicon oxide layer and an aluminum oxide layer are stacked from the charge storage film 53 side.

A memory film 55 that can store data includes the tunneling insulating film 52, the charge storage film 53, and the blocking insulating film 54. Accordingly, the memory film 55 is disposed between the silicon pillar 50 and the electrode films 32.

Thereby, a memory cell transistor MC that has a MONOS (Metal-Oxide-Nitride-Oxide-Silicon) structure with the memory film 55 interposed is configured at each crossing portion between the silicon pillars 50 and the word lines WL. The memory cell transistors MC are arranged in a three-dimensional matrix configuration because the silicon pillars 50 are arranged in a matrix configuration along the X-direction and the Y-direction and because the word lines WL are arranged along the Z-direction. Thereby, a NAND string in which the multiple memory cell transistors MC are connected in series is formed between the bit line 47 and the source line 29. Also, any memory cell transistor MC can be selected by selectively applying potentials to the word lines WL, etc., by switching the transistors 20 ON/OFF.

Effects of the embodiment will now be described.

In the semiconductor memory device 1 according to the embodiment, the transistors 20 that select the word lines WL, etc., are disposed between the semiconductor substrate 10 and the stacked body 30. Thereby, the chip surface area can be reduced compared to the case where the transistors 20 are disposed at the periphery of the stacked body 30. As a result, the integration of the semiconductor memory device 1 can be increased; and the cost can be reduced.

Also, in the embodiment, in the X-direction end portion 30a of the stacked body 30, the regions R1, in which the terraces 33a that are narrower than the minimum arrangement period P of the transistors 20 are formed, and the regions R2, in which the terraces 33b that are wider than the minimum arrangement period P are formed, are arranged alternately. Thereby, the minimum arrangement period P of the transistors 20 and the average arrangement period of the terraces 33a and 33b substantially match; and the connections between the electrode films 32 and the transistors 20 are easy. Also, the contacts 41 that are disposed in the region R1 are drawn out to the region R2 by the upper layer word lines 43 and are connected to the diffusion regions 22 via the contacts 42 piercing the stacked body 30 disposed in the region R2. Thereby, the arrangement density of the contacts 42 can be reduced by effectively utilizing the region R2. As a result, the layout of the contacts 41, the contacts 42, and the upper layer word lines 43 is easy.

The semiconductor memory device 1 is not enlarged even in the case where the region R2 is provided because the length in the X-direction of the region necessary for arranging the multiple transistors 20 is longer than the length in the X-direction of the end portion 30a.

Further, when patterning the end portion 30a of the stacked body 30 into the staircase configuration, the stacked body 30 is formed on the entire surface of the semiconductor substrate 10; a resist film is formed on the stacked body 30; subsequently, the terraces are formed by partially removing the electrode films 32 one layer at a time by alternately performing etching using the resist film as a mask and slimming of the resist film. In such a case, although the width of the terrace widens as the slimming amount of one slimming of the resist film increases, it is necessary to set the initial height of the resist film to be high; and the patterning is difficult.

Therefore, in the embodiment, a unit process that includes the forming of the resist film, the multiple repeating of the slimming and the etching, and the removing of the resist film is multiply implemented. Thereby, the multiple terraces 33a are formed in one region R1 by one unit process or multiple unit processes implemented continuously. Then, the region between the final patterned end of one or multiple unit processes for forming some region R1 and the initial patterned end of one or multiple unit processes for forming the next region R1 becomes the region R2. Thus, compared to the case where terraces of uniform widths are formed, the slimming amount of one slimming can be reduced; and the initial height of the resist film can be reduced. As a result, the manufacturing of the semiconductor memory device 1 is easy.

(Second Embodiment)

A second embodiment will now be described.

Figure 5:
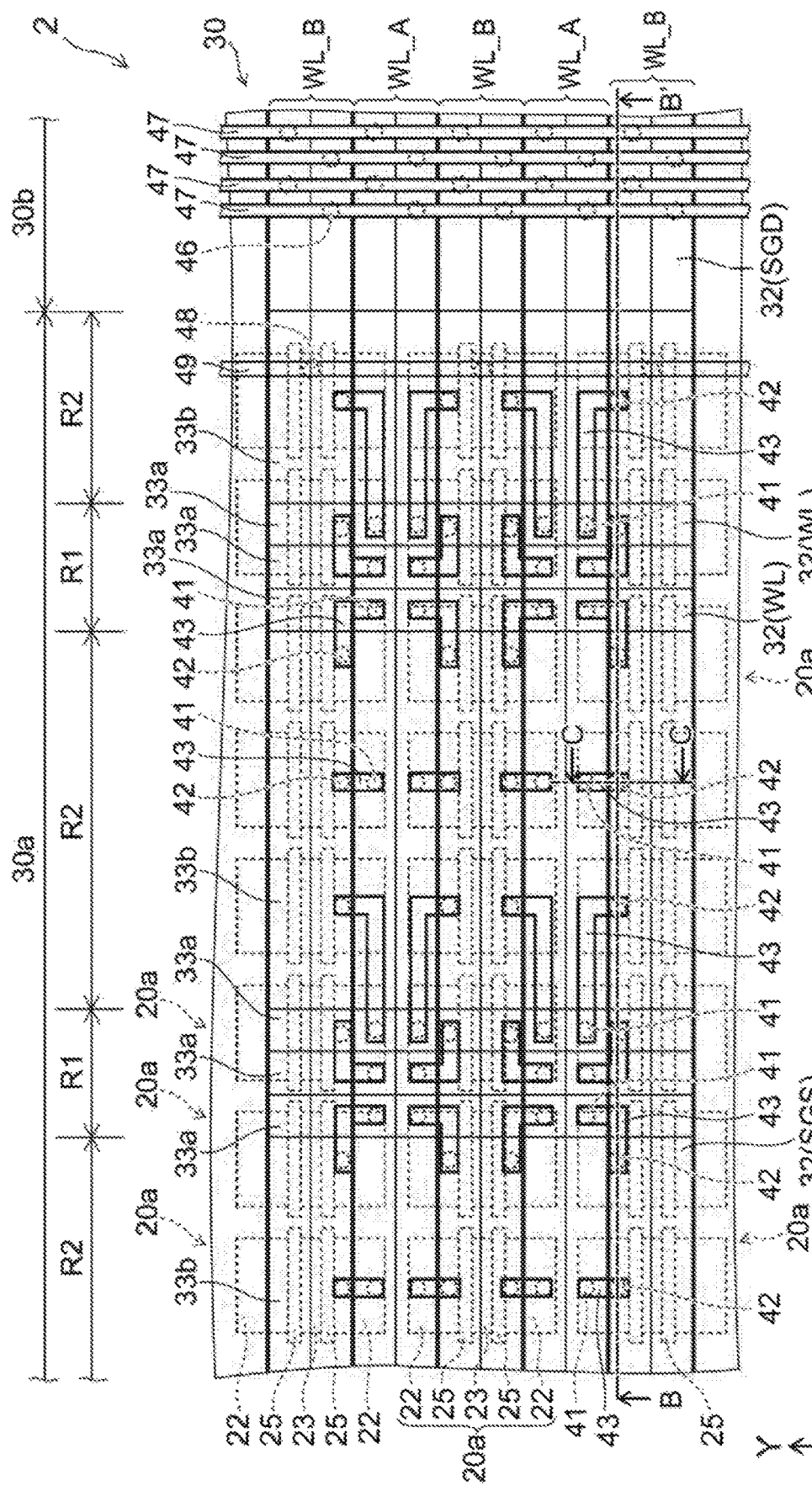
FIG. 5 is a plan view showing a semiconductor memory device according to a second embodiment.

FIG. 5 is a plan view showing a semiconductor memory device according to the embodiment.

Figure 6:
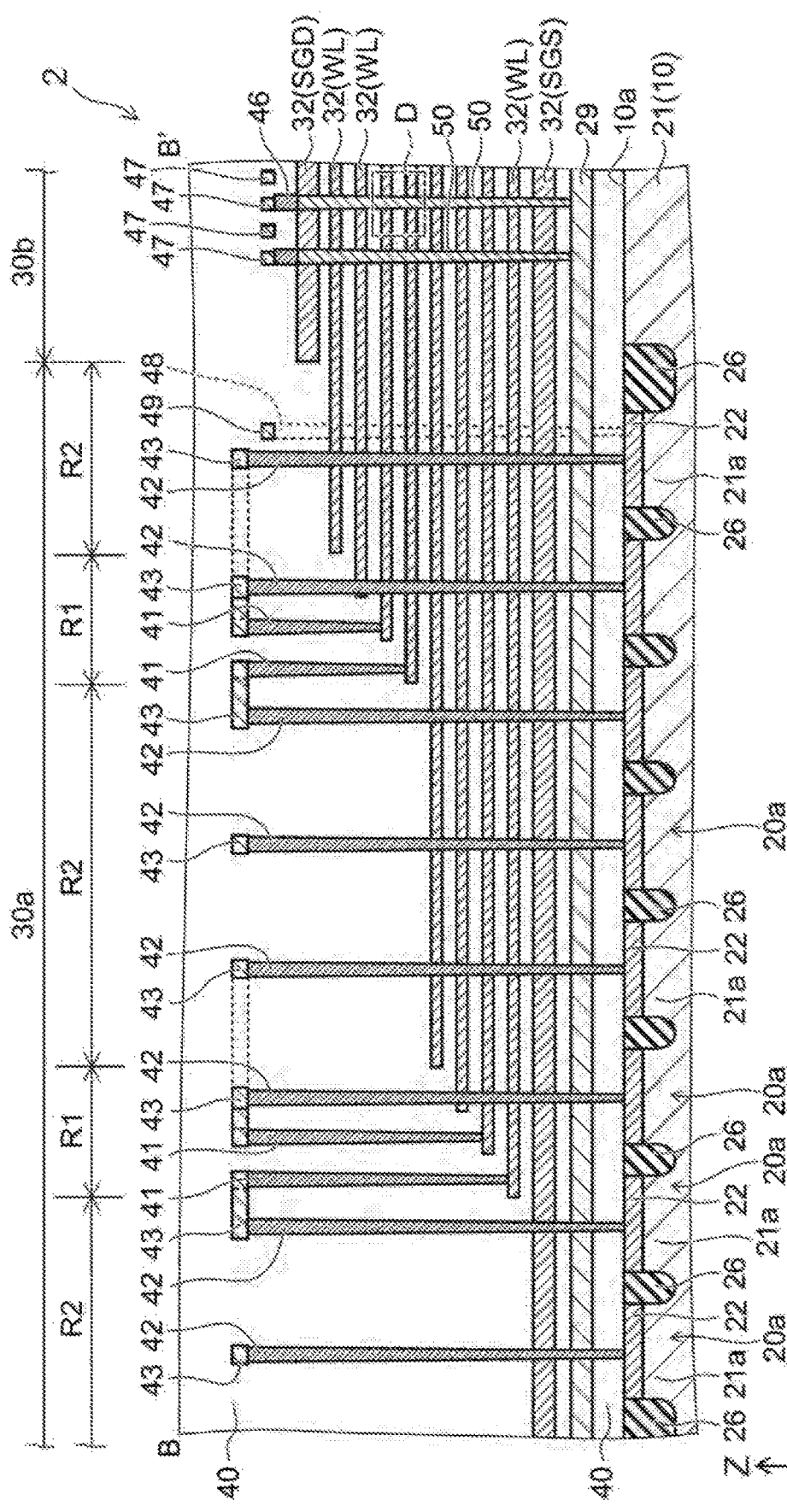
FIG. 6 is a cross-sectional view along line B-B' shown in FIG. 5.

FIG. 6 is a cross-sectional view along line B-B' shown in FIG. 5.

Figure 7:
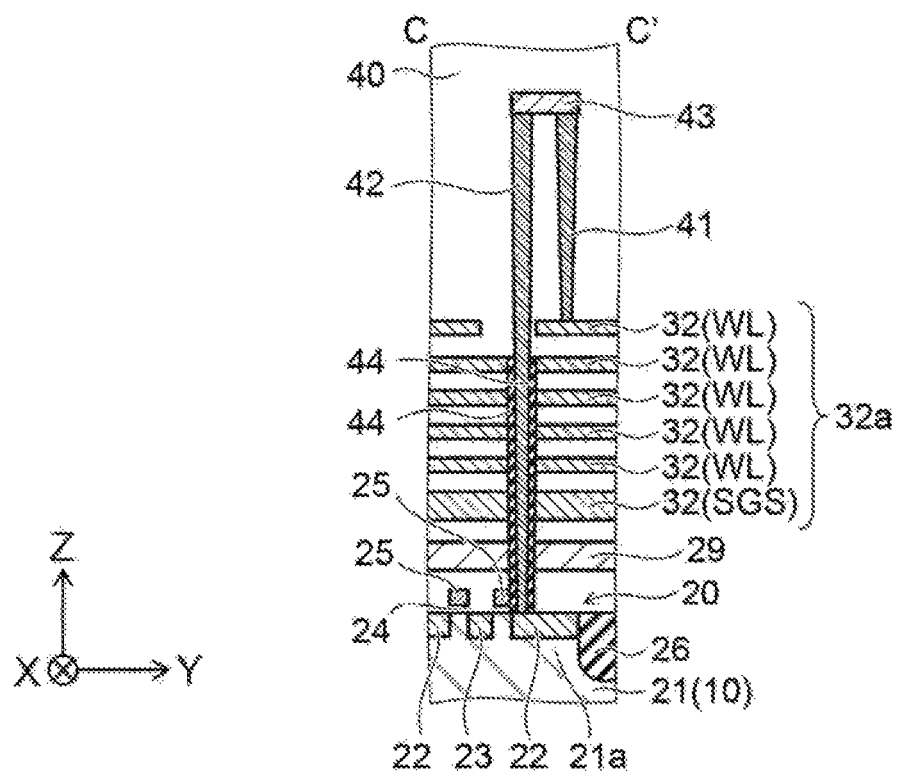
FIG. 7 is a cross-sectional view along line C-C' shown in FIG. 5.

FIG. 7 is a cross-sectional view along line C-C' shown in FIG. 5.

Figure 8:
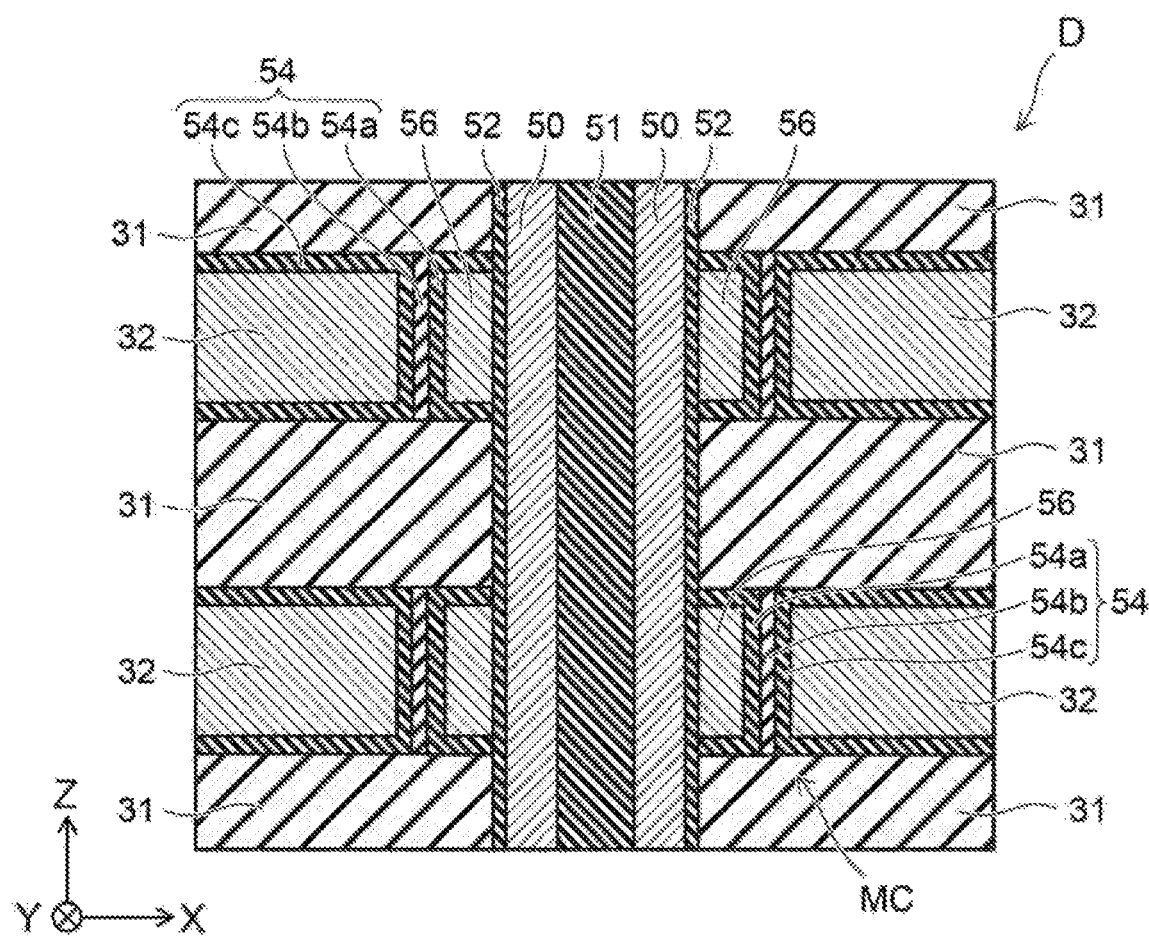
FIG. 8 is a partially enlarged cross-sectional view showing region D of FIG. 6.

FIG. 8 is a partially enlarged cross-sectional view showing region D of FIG. 6.

As shown in FIG. 5 to FIG. 7, the semiconductor memory device 2 according to the embodiment differs from the semiconductor memory device 1 according to the first embodiment described above (referring to FIG. 1 to FIG. 4) in that transistors 20a are provided instead of the transistors 20. One diffusion region 23 is provided between two diffusion regions 22 in the transistor 20a. A contact (not illustrated) for supplying a source potential to the transistor 20 is connected to the diffusion region 23. Also, two gate electrodes 25 are provided and are disposed in the regions directly above the regions of the well 21 between the diffusion region 23 and the diffusion regions 22. Thereby, two transistor elements that are driven independently are included inside one transistor 20a.

Also, in the semiconductor memory device 2, the staircase of the end portion 30a is formed not only along the X-direction but also along the Y-direction. Accordingly, the terraces 33a and 33b are arranged in a chessboard-like configuration when viewed from the Z-direction. Thereby, the length in the X-direction of the end portion 30a can be shortened. Similarly to the first embodiment described above, the upper surface of the end portion 30a descends, at any position in the Y-direction, in stages and without increasing partway, along the X-direction from the central portion 30b toward the end portion 30a of the stacked body 30, that is, along a direction away from the silicon pillars 50.

Further, in the semiconductor memory device 2, the multiple word lines WL that are arranged in the Y-direction are drawn out alternately to the two X-direction sides of the central portion 30b. In other words, when the multiple word lines WL that are arranged along the Y-direction are alternately named word lines WL_A and word lines WL_B, in the end portion 30a shown in FIG. 5 to FIG. 7, the contacts 41 are connected to only the word lines WL_A. On the other hand, at the end portion 30a on the opposite side of the stacked body 30 in the X-direction (not illustrated), the word lines WL_B are connected to the contacts 41. Thus, by drawing out the word lines WL alternately to the two X-direction sides of the stacked body 30, the layout of the contacts 41 and the upper layer word lines 43 can have ample margin.

As described above, in the end portion 30a shown in FIG. 5 to FIG. 7, the contacts 41 are connected to only the word lines WL_A. Accordingly, the contacts 41 are disposed only in the regions directly above the word lines WL_A. On the other hand, the contacts 42 pierce the word lines WL_B. Therefore, the upper layer word lines 43 extend from the regions directly above the word lines WL_A to the regions directly above the word lines WL_B. In other words, portions that extend in the Y-direction exist in the upper layer word lines 43. Thus, in the semiconductor memory device 2, the contacts 41 that are disposed in the regions directly above the word lines WL_A are drawn out to the regions directly above the word lines WL_B by the upper layer word lines 43 and are connected to the diffusion regions 22 of the transistors 20a via the contacts 42. Thereby, the constraints of the layout of the contacts 41, the contacts 42, and the upper layer word lines 43 are relaxed because the contacts 41 and the contacts 42 can be arranged to be dispersed in the Y-direction.

Also, in the embodiment as well, similarly to the first embodiment described above, some of the contacts 41 disposed in the region R1 are connected to the contacts 42 disposed in the region R2. Thereby, the constraints of the arrangement of the contacts 42 in the X-direction are relaxed. Thereby, the layout of the contacts 41, the contacts 42, and the upper layer word lines 43 is easy. The contacts 41, the contacts 42, and the upper layer word lines 43 are arranged similarly in the end portion 30a on the opposite X-direction side (not illustrated) as well.

Further, contacts 48 are provided on the diffusion regions 23 of the transistors 20a. The lower ends of the contacts 48 are connected to the diffusion regions 23. The contacts 48 extend in the Z-direction and pierce the source line 29 and the end portion 30a of the stacked body 30. However, the contacts 48 are insulated from the source line 29 and the electrode films 32. An upper layer source line 49 is provided on the contacts 48. The upper ends of the contacts 48 are connected to the upper layer source line 49. For example, the upper layer source line 49 extends in the Y-direction. In FIG. 5 and FIG. 6, only one upper layer source line 49 is shown for easier viewing of the drawing.

As shown in FIG. 8, a floating electrode-type memory cell transistor MC is formed in the semiconductor memory device 2 according to the embodiment. In other words, a floating gate electrode 56 that is made of, for example, a conductive material such as polysilicon or the like is provided between the electrode film 32 and the columnar body made of the core member 51, the silicon pillar 50, and the tunneling insulating film 52. The configuration of the floating gate electrode 56 is a circular ring configuration surrounding the tunneling insulating film 52. The floating gate electrode 56 functions as a charge storage member. The blocking insulating film 54 is provided between the floating gate electrode 56 and the electrode film 32. For example, an aluminum oxide layer 54a that covers the upper surface of the floating gate electrode 56, the lower surface of the floating gate electrode 56, and the side surface of the floating gate electrode 56 on the electrode film 32 side is provided in the blocking insulating film 54; an aluminum oxide layer 54c that covers the upper surface of the electrode film 32, the lower surface of the electrode film 32, and the side surface of the electrode film 32 on the floating gate electrode 56 side is provided in the blocking insulating film 54; and a silicon oxide layer 54b that is disposed between the aluminum oxide layer 54a and the aluminum oxide layer 54c is provided in the blocking insulating film 54.

Effects of the embodiment will now be described.

In the embodiment, the contacts 41 are disposed in the regions directly above the word lines WL_A; the contacts 42 are disposed in the placement regions of the word lines WL_B; and the upper ends of the contacts 41 and the upper ends of the contacts 42 are connected by the upper layer word lines 43. Thereby, the word lines WL_A can be connected to the diffusion regions 22 by effectively utilizing the placement regions of the word lines WL_B which are originally dead space. As a result, the spacing between the contacts 41 and the contacts 42 can be ensured; and the layout can be made easily. Otherwise, the configuration and the effects of the embodiment are similar to those of the first embodiment described above.

(Third Embodiment)

A third embodiment will now be described.

Figure 9:
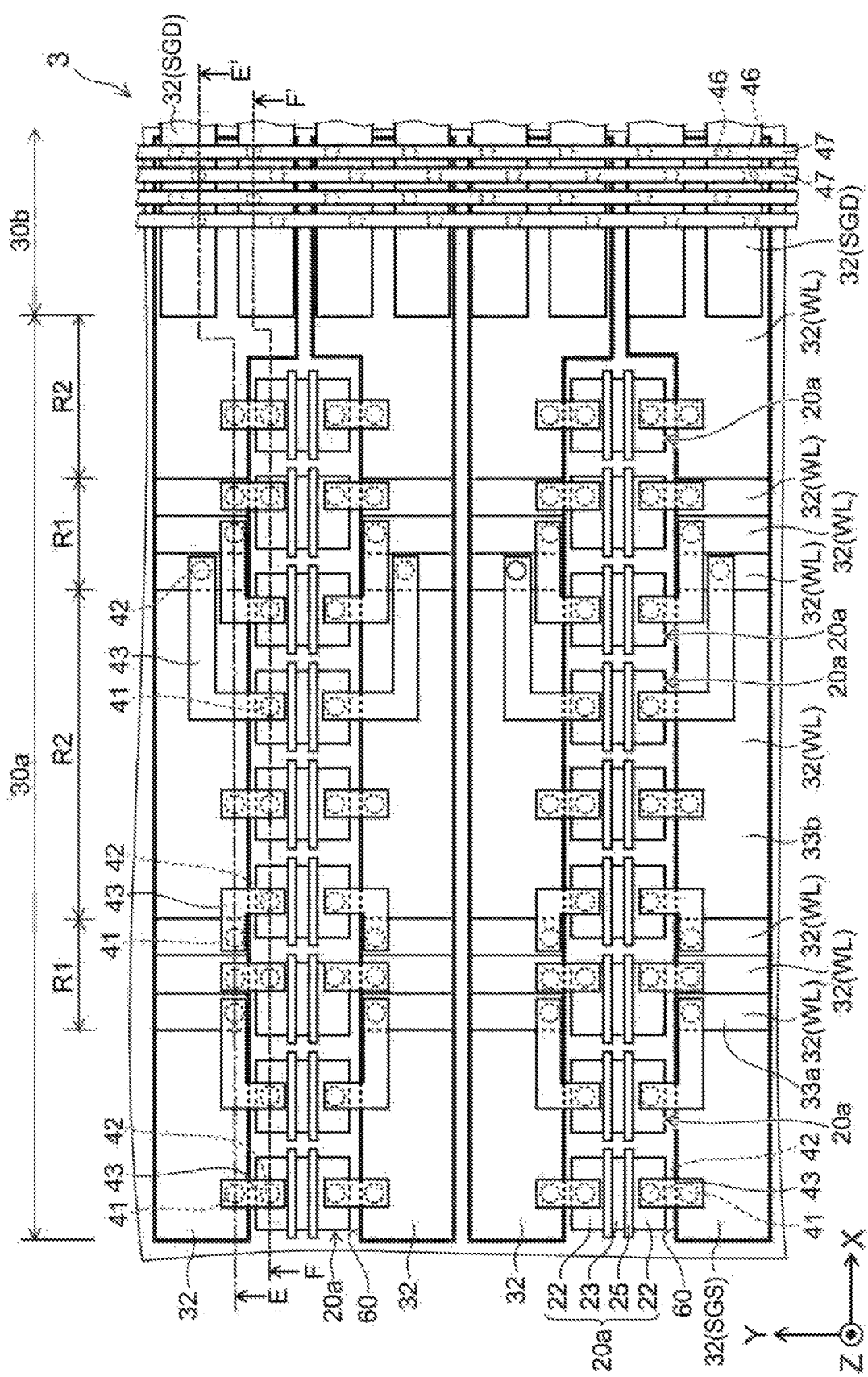
FIG. 9 is a plan view showing a semiconductor memory device according to a third embodiment.

FIG. 9 is a plan view showing a semiconductor memory device according to the embodiment.

Figure 10:
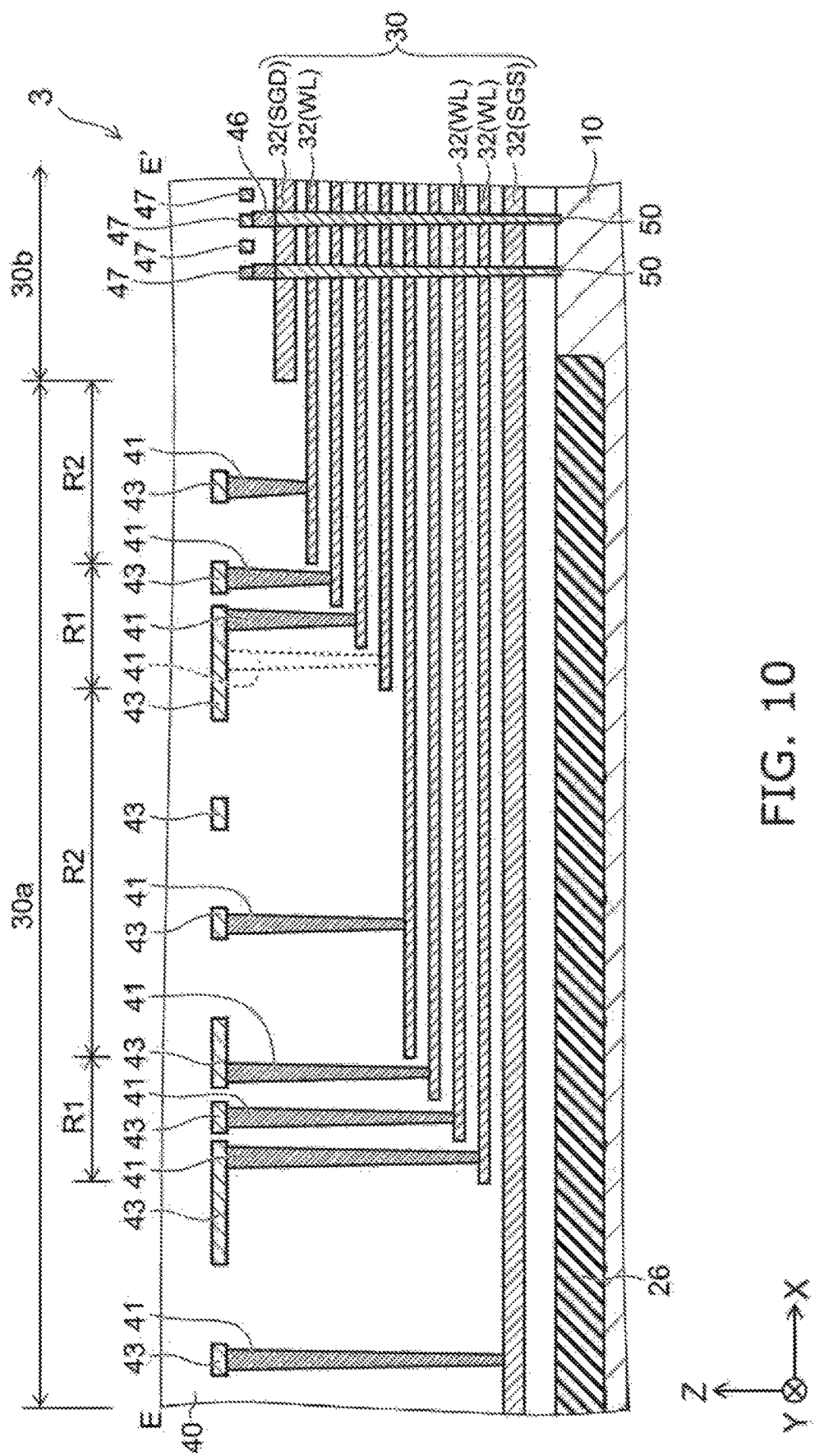
FIG. 10 is a cross-sectional view along line E-E' shown in FIG. 9.

FIG. 10 is a cross-sectional view along line E-E' shown in FIG. 9.

Figure 11:
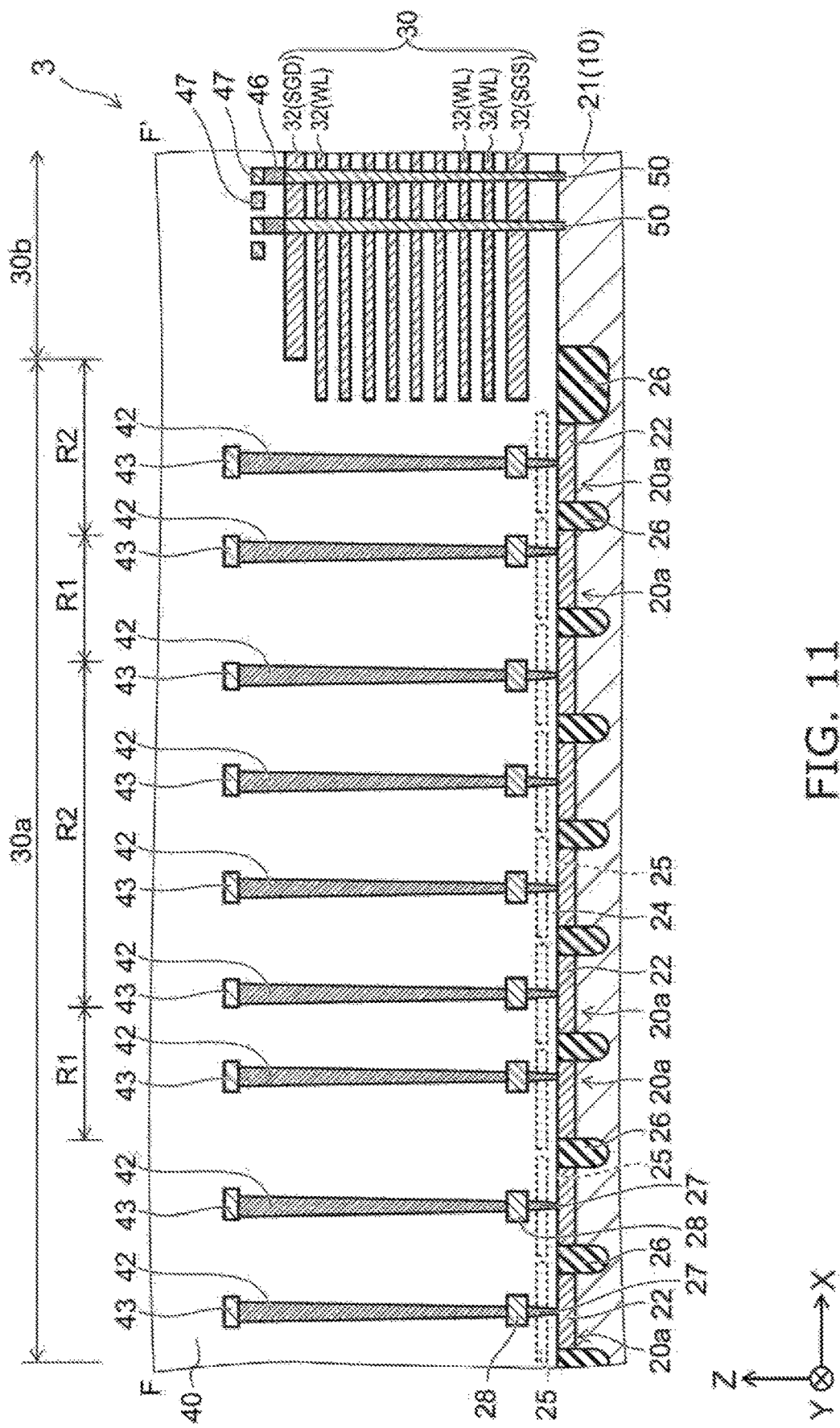
FIG. 11 is a cross-sectional view along line F-F' shown in FIG. 9.

FIG. 11 is a cross-sectional view along line F-F' shown in FIG. 9.

In the semiconductor memory device 3 according to the embodiment as shown in FIG. 9 to FIG. 11, the source line 29 (referring to FIG. 1) is not provided; and the lower ends of the silicon pillars 50 are connected to the semiconductor substrate 10. Also, in the end portion 30a of the stacked body 30, a slit 60 that extends in the X-direction is formed between the word lines WL and between the source-side selection gates SGS adjacent to each other in the Y-direction. Inside the slit 60, the electrode films 32 are not disposed; and the insulating film 40 is filled. Also, the transistors 20a are formed only in the region directly under the slit 60; and the contacts 42 are disposed inside the slit 60. On the other hand, the contacts 41 are disposed in the regions directly above the electrode films 32. Thus, the contacts 41 and the contacts 42 are separated in the Y-direction. Accordingly, portions that extend in the Y-direction exist in all of the upper layer word lines 43; and portions that extend in the X-direction also exist in some of the upper layer word lines 43. Also, in the embodiment as well, a staircase along the X-direction is formed in the end portion 30a of the stacked body 30.

In the semiconductor memory device 3 according to the embodiment, the source line 29 is not provided; and the semiconductor substrate 10 functions as the source line. Thereby, the number of manufacturing processes and/or patterning time of the semiconductor memory device 4 can be suppressed; and the manufacturing is easy. Also, the interference between the electrode films 32 on the lower layer side and the upper structure bodies and accessory structure bodies of the transistors 20a such as the gate electrodes 25, the contacts 27, the lower layer interconnects 28, etc., can be avoided by providing the slit 60 in the end portion 30a of the stacked body 30 and by disposing the transistors 20a in the region directly under the slit 60. Also, the arrangement of the contacts 41 and 42 and the draw-out of the upper layer word lines 43 are easy because the regions where the contacts 41 are disposed and the regions where the contacts 42 are disposed are separated. Otherwise, the configuration and the effects of the embodiment are similar to those of the second embodiment described above.

(Fourth Embodiment)

A fourth embodiment will now be described.

Figure 12:
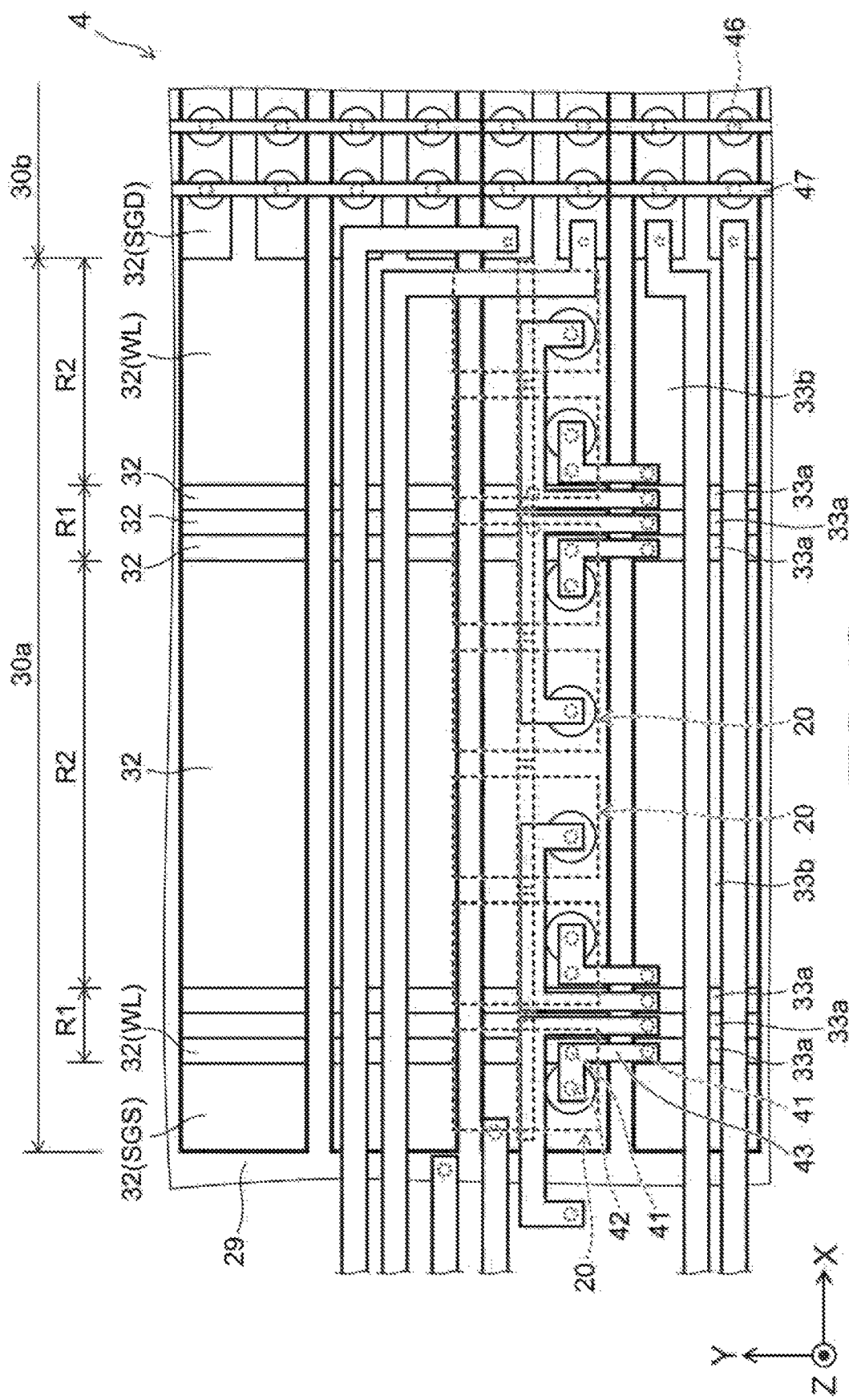
FIG. 12 is a plan view showing a semiconductor memory device according to a fourth embodiment.

FIG. 12 is a plan view showing a semiconductor memory device according to the embodiment.

In the semiconductor memory device 4 according to the embodiment as shown in FIG. 12, multiple word lines WL that are arranged along the Y-direction are connected to the diffusion region 22 of one transistor 20. For example, two contacts 41 that are connected to two word lines WL adjacent to each other in the Y-direction and one contact 42 that is connected to the diffusion region 22 of one transistor 20 are connected to one upper layer word line 43.

According to the embodiment, the number of the transistors 20 can be reduced. Otherwise, the configuration and the effects of the embodiment are similar to those of the first embodiment described above.

(Fifth Embodiment)

A fifth embodiment will now be described.

Figure 13:
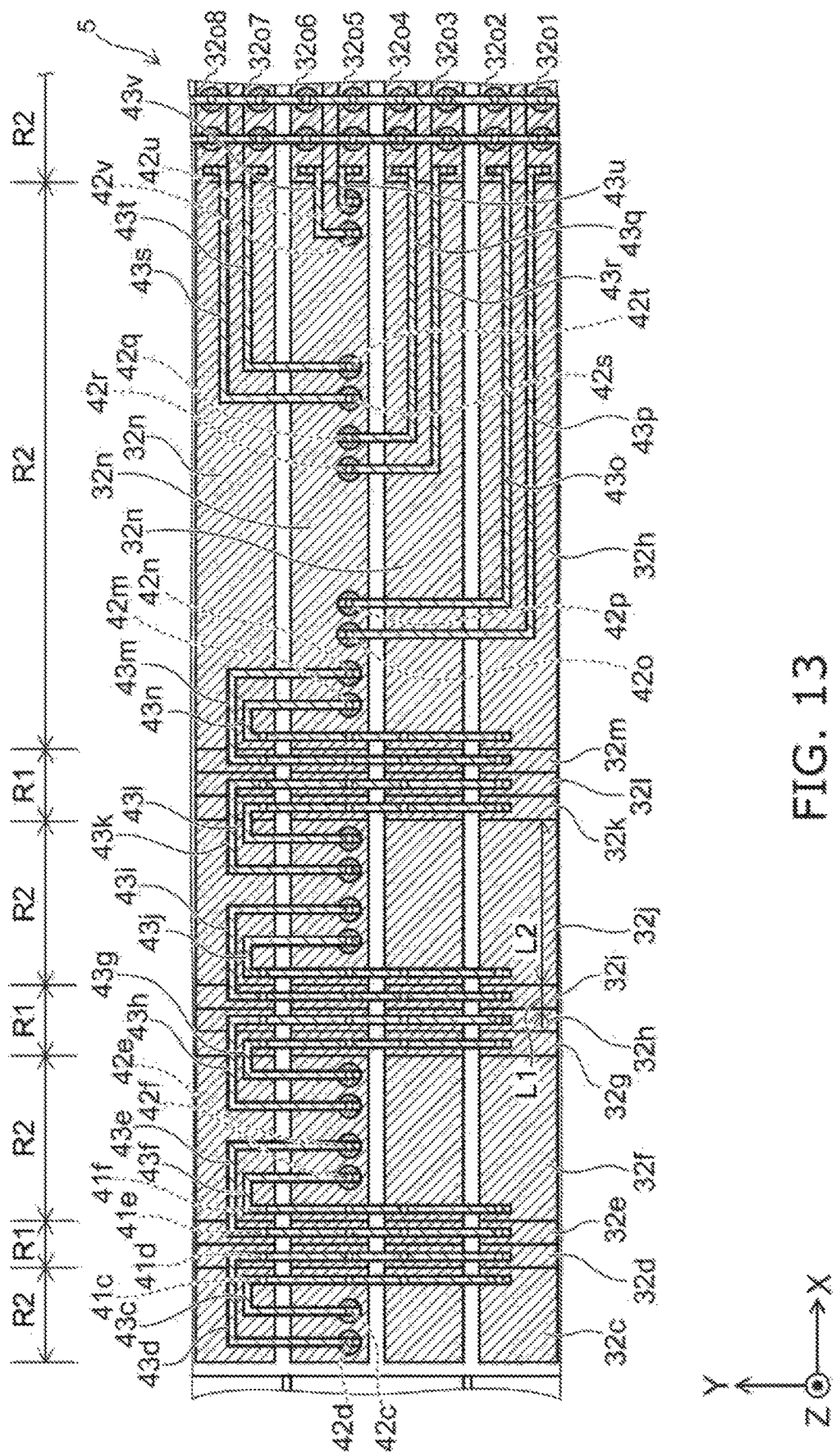
FIG. 13 is a plan view showing a stacked body of a semiconductor memory device according to a fifth embodiment.

FIG. 13 is a plan view showing the stacked body of a semiconductor memory device according to the embodiment.

Figure 14:
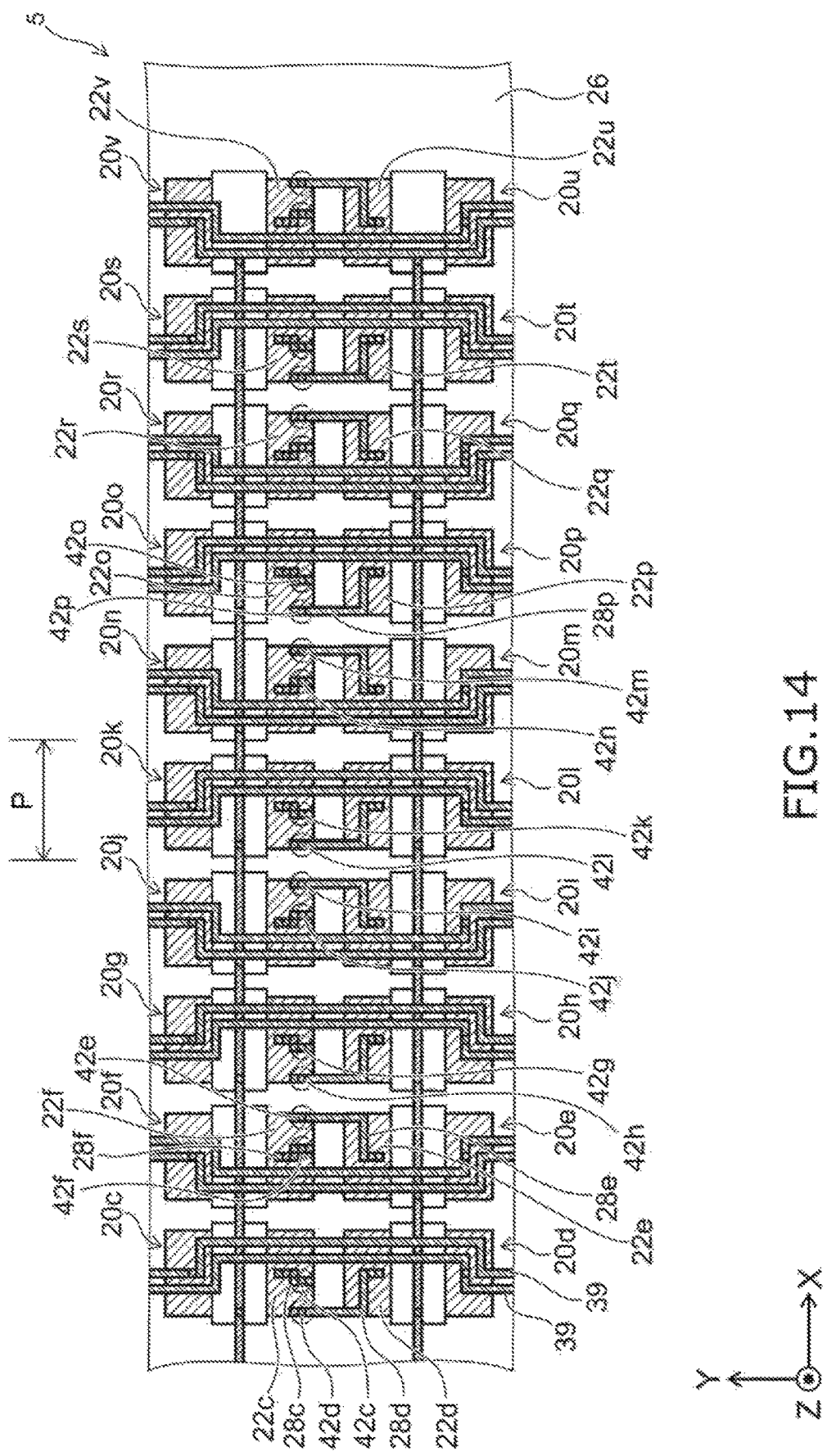
FIG. 14 is a plan view showing a semiconductor substrate of the semiconductor memory device according to the fifth embodiment.

FIG. 14 is a plan view showing the semiconductor substrate of the semiconductor memory device according to the embodiment.

Figure 15:
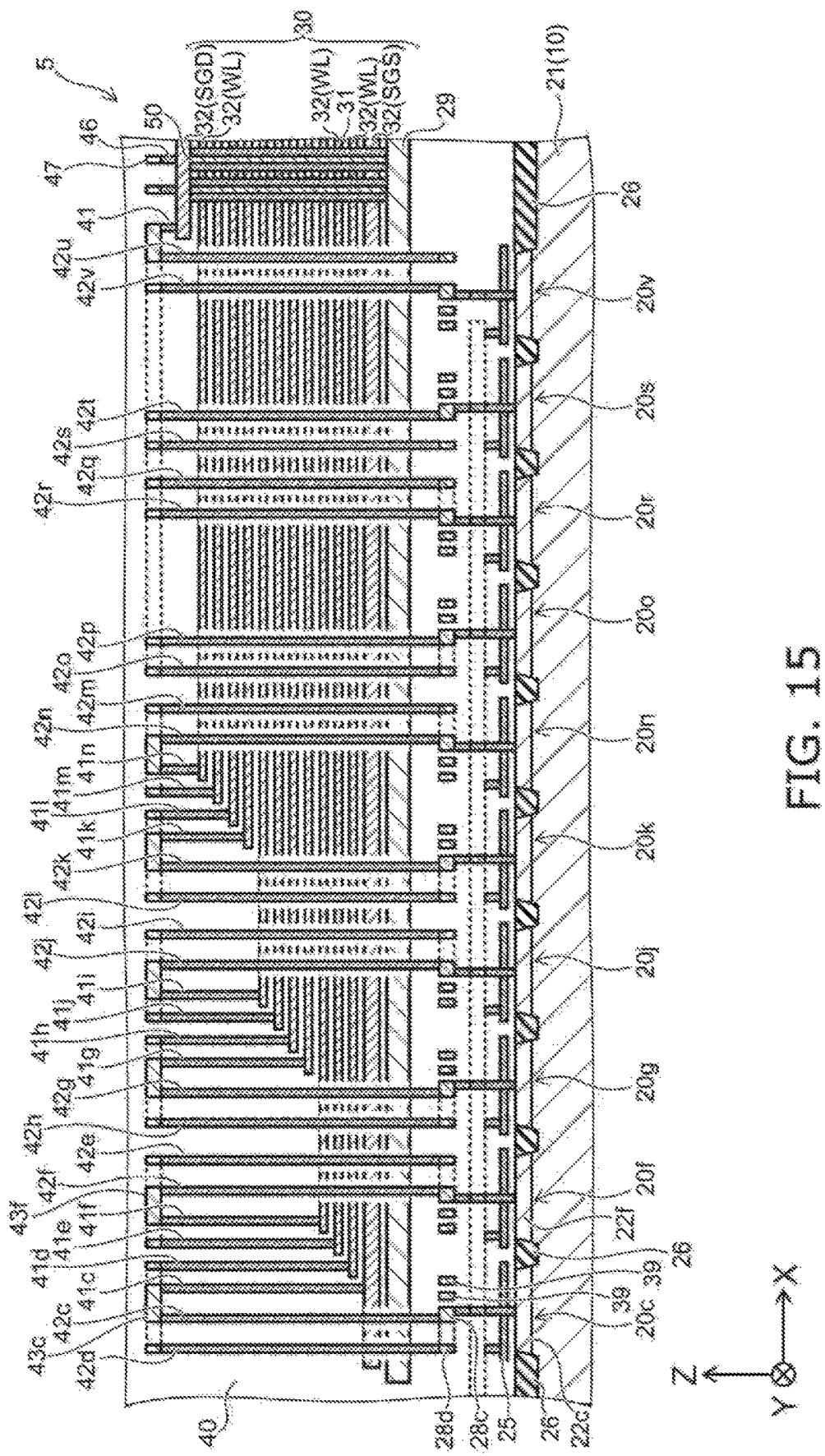
FIG. 15 is a cross-sectional view showing the semiconductor memory device according to the fifth embodiment.

FIG. 15 is a cross-sectional view showing the semiconductor memory device according to the embodiment.

In the semiconductor memory device 5 according to the embodiment as shown in FIG. 13 to FIG. 15, the transistors 20 of one memory block are arranged in multiple rows not only along the X-direction but also along the Y-direction. Also, the diffusion region 22 of one transistor 20 is connected to multiple, e.g., four electrode films 32. The contacts 42 are disposed in the region R2 and are arranged in one column along the X-direction. In the embodiment as well, the length L1 of the terrace 33a in the X-direction is shorter than the minimum arrangement period P of the transistors 20; and the length L2 of the terrace 33b is longer than the minimum arrangement period P of the transistors 20. In other words, L1<P<L2 holds.

The configuration of the semiconductor memory device 5 will now be described in detail.

In the semiconductor memory device 5, the electrode films 32 of thirteen layers arranged along the Z-direction are provided. These electrode films 32 are taken as electrode films 32c to 32o in order from the lower layer side. The electrode films 32c of the lowermost layer are the source-side selection gates SGS. In one memory block, four of the electrode films 32c are arranged along the Y-direction and are connected to the same transistor 20. The electrode films from the electrode films 32d that are second from the lowermost layer to the electrode films 32n that are second from the uppermost layer are the word lines WL. In one memory block, the electrode films 32d to 32n each are arranged along the Y-direction and are connected respectively to the same transistors 20.

The electrode films 32o of the uppermost layer are the drain-side selection gates SGD. In one memory block, eight of the electrode films 32o are arranged along the Y-direction and are connected to mutually-different transistors 20. The eight electrode films 32o belonging to the one memory block also are called electrode films 32o1 to 32o8. The arrangement period of the drain-side selection gates SGD in the Y-direction is half of the arrangement period of the word lines WL. Accordingly, two drain-side selection gates SGD are disposed in the region directly above one word line WL.

Twenty transistors 20 are provided in the semiconductor memory device 5. These transistors 20 are taken as transistors 20c to 20v. Also, the diffusion region 22 of the transistor 20c is taken as a diffusion region 22c. Further, the contact 27, the lower layer interconnect 28, the contact 42, the upper layer word line 43, and the contact 41 that are connected to the transistor 20c are respectively taken as a contact 27c, a lower layer interconnect 28c, a contact 42c, an upper layer word line 43c, and a contact 41c. This is similar for transistors 20d to 20v as well.

The diffusion region 22c of the transistor 20c is drawn out substantially directly upward by the contact 27c, the lower layer interconnect 28c, and the contact 42c, is drawn out in the Y-direction by the upper layer word line 43c, goes halfway around in a U-shaped configuration, and is connected to four electrode films 32c (the source-side selection gates SGS) via four contacts 41c.

The transistor 20d is disposed on the Y-direction side when viewed from the transistor 20c. A diffusion region 22d of the transistor 20d is drawn out to the region directly above the diffusion region 22c by a lower layer interconnect 28d, is drawn out directly upward by a contact 42d, goes halfway around outside the upper layer word line 43c by an upper layer word line 43d, and is connected to four electrode films 32d (the word lines WL) via four contacts 41d.

A transistor 20e is disposed on the X-direction side when viewed from the transistor 20d. A diffusion region 22e of the transistor 20e is drawn out to the region directly above a diffusion region 22f by a lower layer interconnect 28e, is drawn out directly upward by a contact 42e, goes halfway around in the reverse direction of the upper layer word line 43d by an upper layer word line 43e, and is connected to four electrode films 32e (the word lines WL) via four contacts 41e.

The transistor 20f is disposed on the Y-direction side when viewed from the transistor 20e. The diffusion region 22f of the transistor 20f is drawn out substantially directly upward by a contact 27f, a lower layer interconnect 28f, and a contact 42f, goes halfway around inside the upper layer word line 43e by an upper layer word line 43f, and is connected to four electrode films 32f (the word lines WL) via four contacts 41f.

Thus, the transistors 20c to 20f are connected respectively to the four electrode films 32c to 32f. Also, the diffusion regions 23 of the transistors 20c to 20f are connected to lower layer interconnects 39. The lower layer interconnects 39 extend substantially in the Y-direction. The positions in the Z-direction of the lower layer interconnects 39 are the same as the positions in the Z-direction of the lower layer interconnects 28. The main line portions of the lower layer interconnects 39 may be upper layer interconnects; and in such a case, the lower layer interconnects 39 are connected to the upper layer interconnects used as the main line portions via additional contacts.

The transistors 20g to 20j are connected respectively to the four electrode films 32g to 32j by a halfway-around interconnect pattern similar to the current paths from the transistors 20c to 20f to the electrode films 32c to 32f. Also, the transistors 20k to 20n are connected respectively to the four electrode films 32k to 32n by a similar halfway-around interconnect pattern.

A diffusion region 22o of the transistor 20o is drawn out substantially directly upward by a contact 27o, a lower layer interconnect 28o, and a contact 42o, is drawn out in the Y-direction by an upper layer word line 43o, subsequently is drawn out in the X-direction, and is connected to one electrode film 32o2 (the drain-side selection gate SGD) via one contact 41o. When viewed from the Z-direction, the configuration of the upper layer word line 43o is an L-shaped configuration.

A diffusion region 22p of the transistor 20p is drawn out to the region directly above the diffusion region 22o by a lower layer interconnect 28p, is drawn out directly upward by a contact 42p, is drawn out in an L-shaped configuration outside the upper layer word line 43o by an upper layer word line 43p, and is connected to one electrode film 32o1 (the drain-side selection gate SGD) via one contact 41p.

By an interconnect pattern having an L-shaped configuration similar to the current paths from the transistors 20o and 20p to the electrode films 32o2 and 32o1, a diffusion region 22q of the transistor 20q is connected to the electrode film 32o4; and a diffusion region 22r of the transistor 20r is connected to the electrode films 32o3.

A diffusion region 22s of the transistor 20s is connected to the electrode film 32o7 and a diffusion region 22t of the transistor 20t is connected to the electrode film 32o8 by an interconnect pattern having a similar L-shaped configuration. Also, a diffusion region 22u of the transistor 20u is connected to the electrode film 32o5; and a diffusion region 22v of the transistor 20v is connected to the electrode film 32o6.

Effects of the embodiment will now be described.

In the embodiment, the placement region of the transistors 20 and the length in the X-direction of the end portion 30a of the stacked body 30 can be shortened because the transistors 20 are arranged not only in the X-direction but also in the Y-direction.

Otherwise, the configuration and the effects of the embodiment are similar to those of the first embodiment described above.

(Sixth Embodiment)

A sixth embodiment will now be described.

Figure 16:
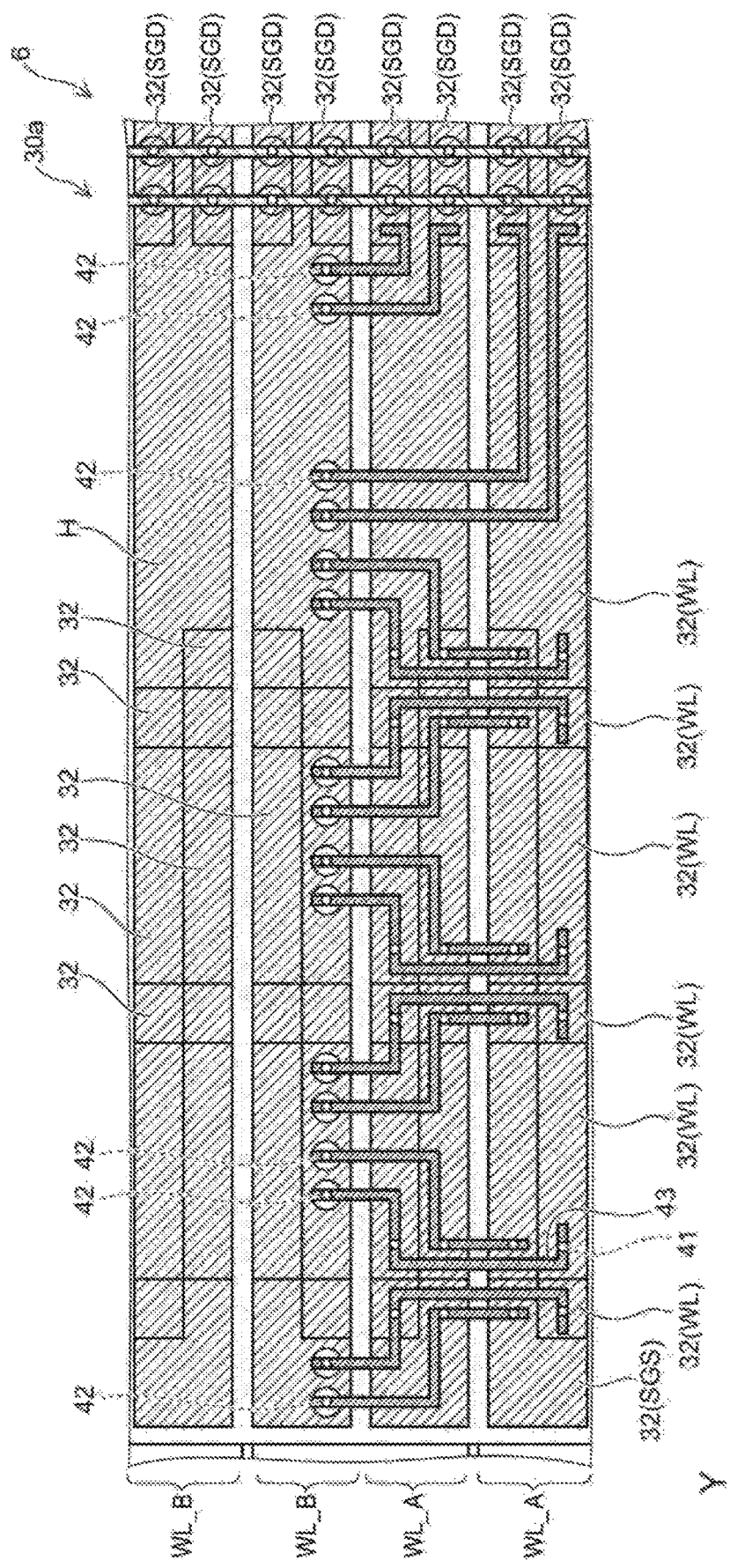
FIG. 16 is a plan view showing a stacked body of a semiconductor memory device according to a sixth embodiment.

FIG. 16 is a plan view showing the stacked body of a semiconductor memory device according to the embodiment.

Figure 17:
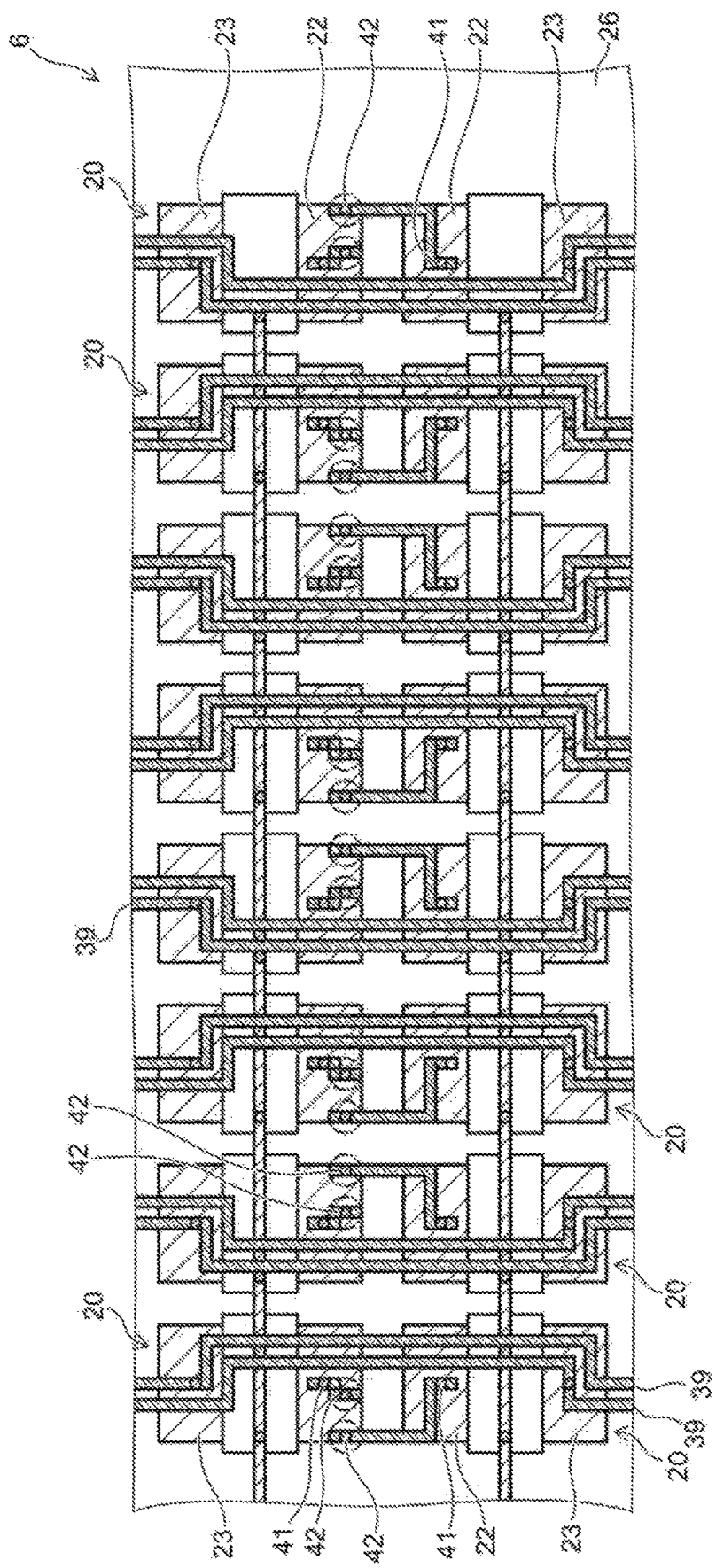
FIG. 17 is a plan view showing a semiconductor substrate of the semiconductor memory device according to the sixth embodiment.

FIG. 17 is a plan view showing the semiconductor substrate of the semiconductor memory device according to the embodiment.

Figure 18:
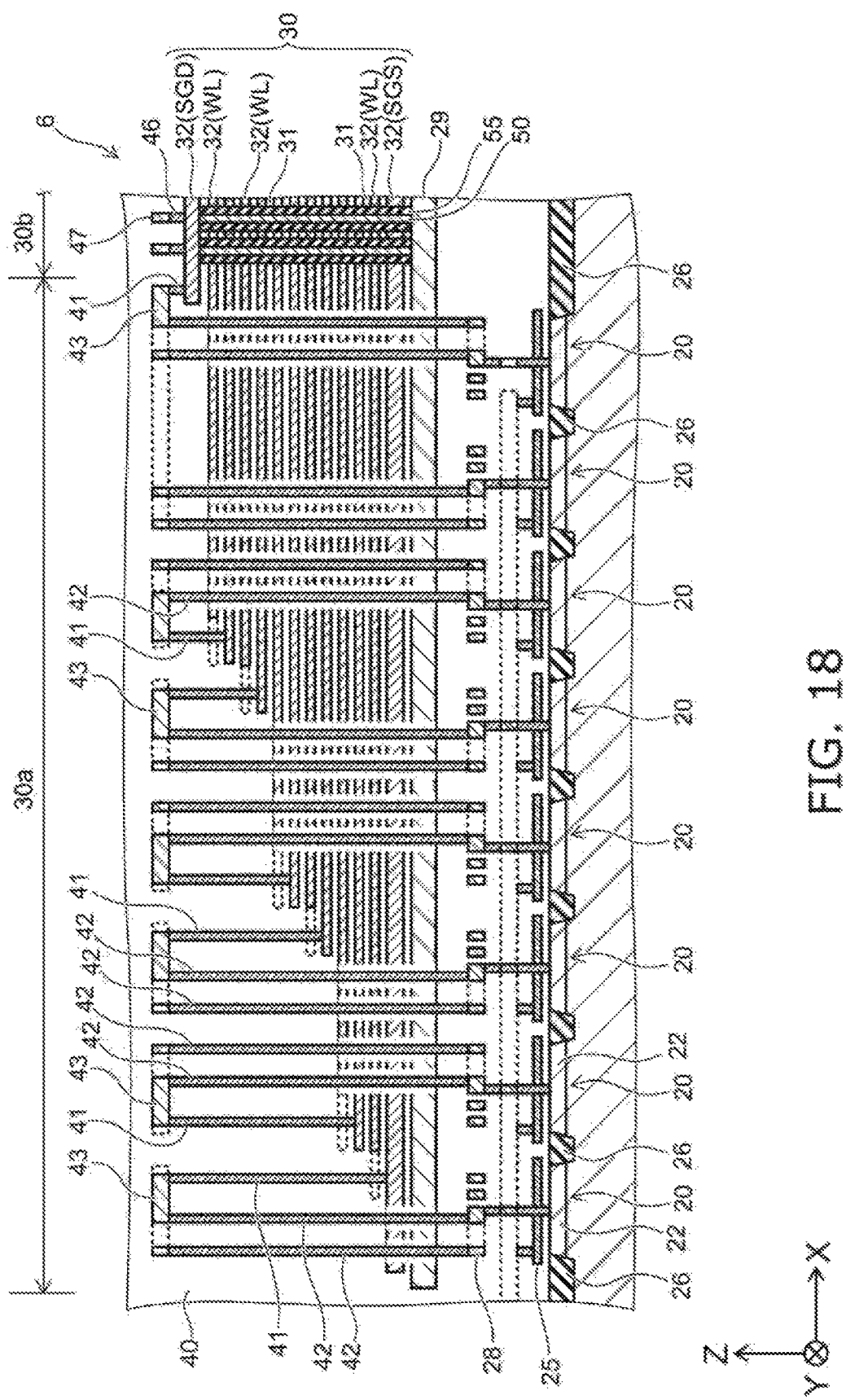
FIG. 18 is a cross-sectional view showing the semiconductor memory device according to the sixth embodiment.

FIG. 18 is a cross-sectional view showing the semiconductor memory device according to the embodiment.

In the semiconductor memory device 6 according to the embodiment as shown in FIG. 16 to FIG. 18, the staircase of the end portion 30a is formed along not only the X-direction but also the Y-direction. The staircase along the X-direction is formed over all of the electrode films 32 arranged along the Z-direction; and one step is formed every two electrode films 32. The staircase along the Y-direction is formed to correspond to only one electrode film 32; and one step is formed for the one electrode film 32. In other words, in the stacked body 30, (n/2) levels of steps are formed by being formed every two electrode films 32 along the X-direction, and only one level of steps corresponding to one electrode film 32 is formed along the Y-direction, where n is the number of the electrode films 32 arranged along the Z-direction. Thereby, the terraces can be formed for all of the n electrode films 32. When the entire end portion 30a is viewed, the configuration of a region H where the terraces are disposed one level higher than the terraces adjacent in the Y-direction is a comb-shaped configuration when viewed from the Z-direction.

Also, in the semiconductor memory device 6, every two word lines WL of the multiple word lines WL arranged along the Y-direction are drawn out alternately to the two X-direction sides of the stacked body 30. In other words, in the end portion 30a shown in FIG. 16 to FIG. 18, the contacts 41 are connected to only the word lines WL_A when the multiple word lines WL arranged along the Y-direction are taken as the word line WL_A, the word line WL_A, the word line WL_B, the word line WL_B, the word line WL_A, the word line WL_A, . . . . On the other hand, the contacts 41 are connected to the word lines WL_B at the end portion 30a on the opposite side (not illustrated).

Further, in the semiconductor memory device 6, similarly to the semiconductor memory device 5 according to the fifth embodiment described above (referring to FIG. 13 to FIG. 15), the transistors 20 are arranged not only along the X-direction but also along the Y-direction. Also, for example, the diffusion region 22 of one transistor 20 is connected to two electrode films 32.

Also, in the end portion 30a shown in FIG. 16 to FIG. 18, the contacts 41 are disposed in the regions directly above the word lines WL_A. On the other hand, the contacts 42 are disposed at positions piercing the word lines WL_B. Therefore, the upper layer word lines 43 extend from the regions directly above the word lines WL_A to the regions directly above the word lines WL_B. Accordingly, portions that extend in the Y-direction exist in the upper layer word lines 43. The contacts 42 are arranged in one column along the X-direction.

Similarly to the word lines WL, the source-side selection gates SGS also are drawn out alternately two at a time to the two X-direction sides of the stacked body 30. The drain-side selection gates SGD are drawn out alternately four at a time to the two X-direction sides of the stacked body 30.

Effects of the embodiment will now be described.

In the end portion 30a of the stacked body 30 in the embodiment, a sub staircase is formed along the Y-direction in addition to the main staircase along the X-direction. Thereby, the length in the X-direction of the end portion 30a can be shortened.

Also, in the embodiment, the electrode films 32 are drawn out alternately to the two X-direction sides of the stacked body 30. Thereby, the number of the transistors 20 formed in the region directly under one end portion 30a can be half compared to the case where the electrode films 32 are drawn out to only one X-direction side. As a result, the layout of the upper layer word lines 43, etc., is made easily.

Further, in the embodiment, the contacts 41 are disposed in the regions directly above the word lines WL_A; and the contacts 42 are disposed in the placement regions of the word lines WL_B. Thereby, the interconnects can be drawn out by effectively utilizing the placement regions of the word lines WL_B which are originally dead space.

Otherwise, the configuration and the effects of the embodiment are similar to those of the first embodiment described above.

(Seventh Embodiment)

A seventh embodiment will now be described.

Figure 19:
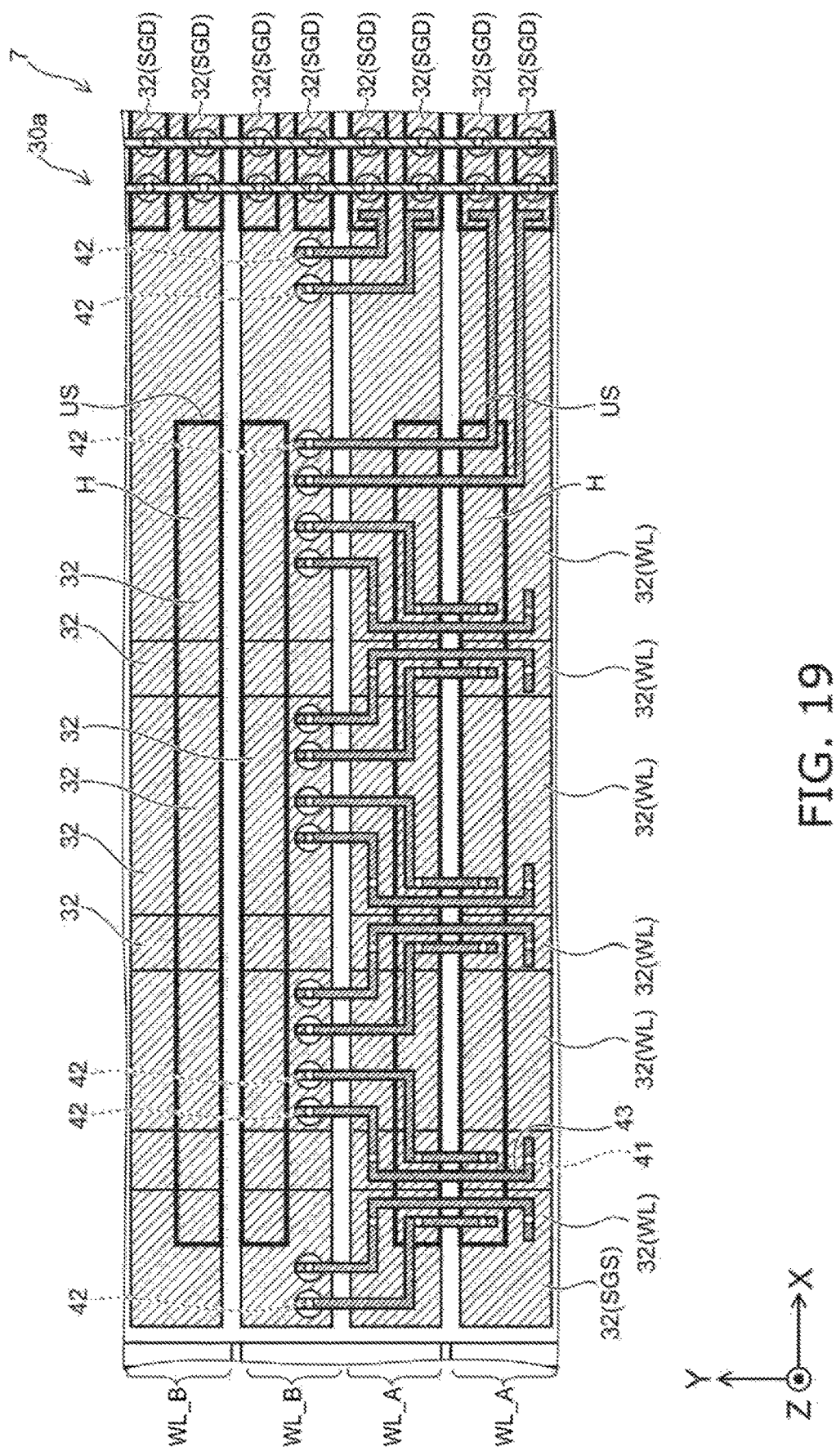
FIG. 19 is a plan view showing a stacked body of a semiconductor memory device according to a seventh embodiment.

FIG. 19 is a plan view showing the stacked body of a semiconductor memory device according to the embodiment.

Figure 20:
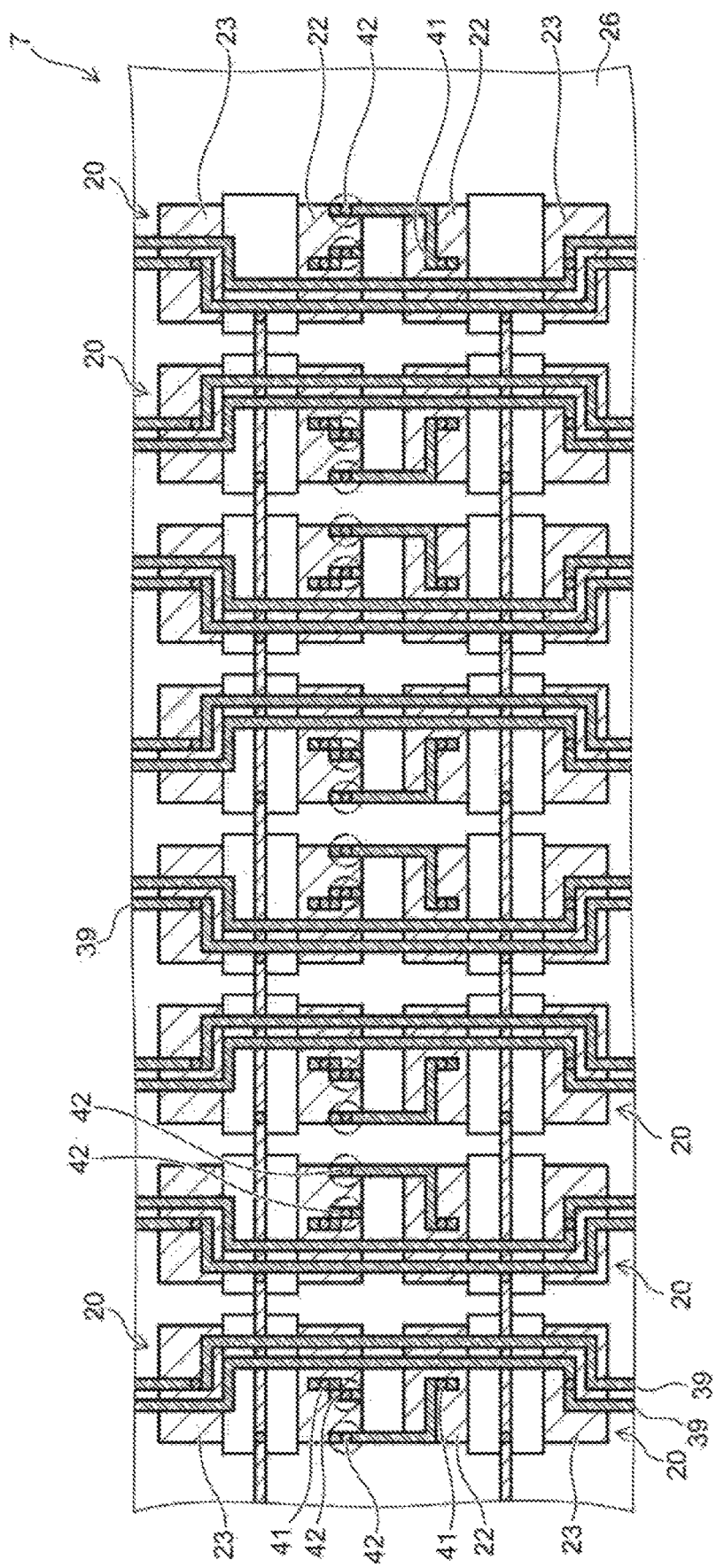
FIG. 20 is a plan view showing a semiconductor substrate of the semiconductor memory device according to the seventh embodiment.

FIG. 20 is a plan view showing the semiconductor substrate of the semiconductor memory device according to the embodiment.

Figure 21:
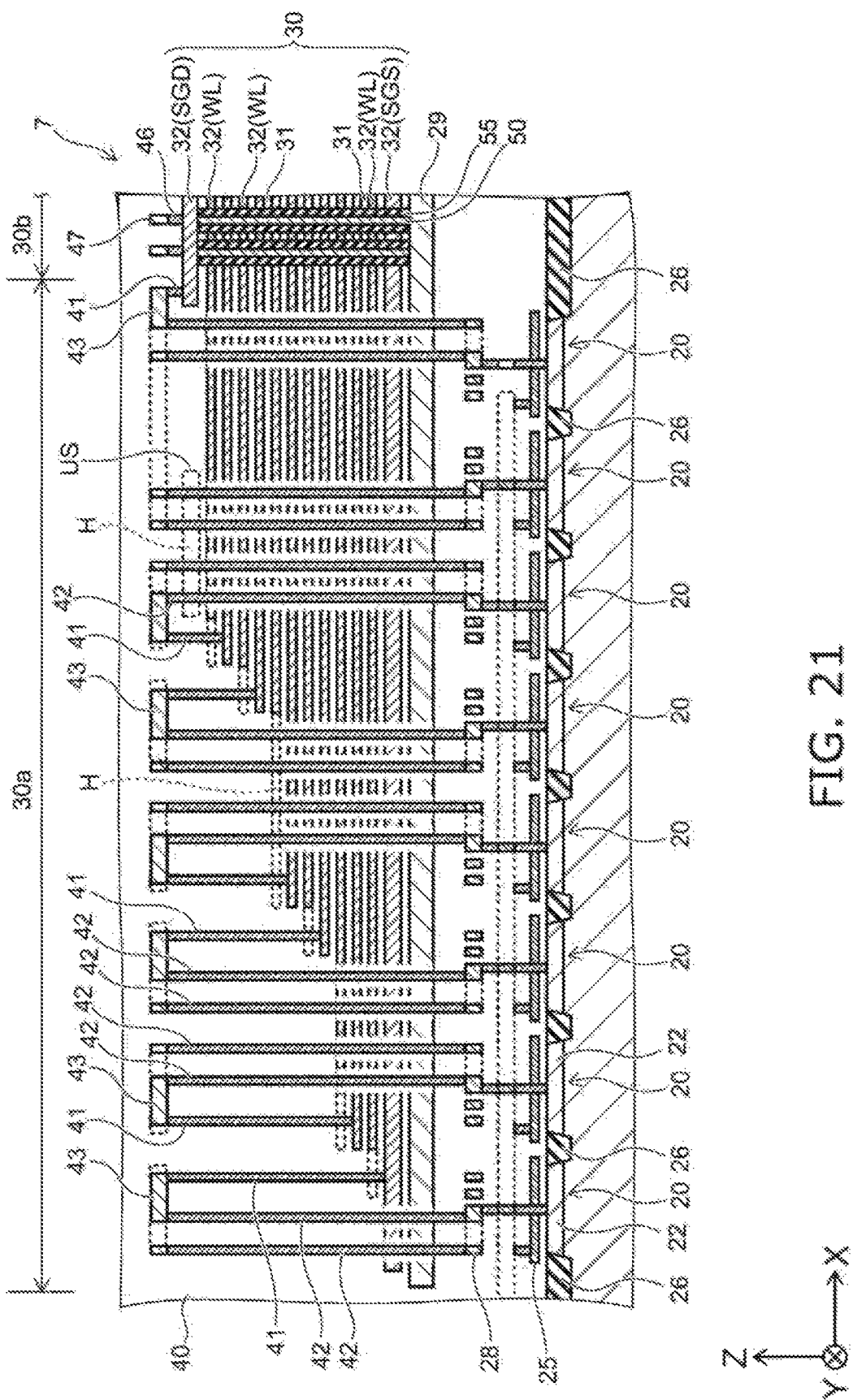
FIG. 21 is a cross-sectional view showing the semiconductor memory device according to the seventh embodiment.

FIG. 21 is a cross-sectional view showing the semiconductor memory device according to the embodiment.

As shown in FIG. 19 to FIG. 21, the semiconductor memory device 7 according to the embodiment differs from the semiconductor memory device 6 according to the sixth embodiment described above (referring to FIG. 16 to FIG. 18) in that the configuration of the region H is an island configuration. As described above, the region H is the region where the terraces are disposed one level higher than the terraces adjacent in the Y-direction.

Thereby, in the embodiment, compared to the sixth embodiment, the electrode films 32 that are connected between the transistors 20 adjacent to each other in the Y-direction are reversed. Also, the end edge on the central portion 30b side of the region H in the direction from the central portion 30b toward the end portion 30a of the stacked body 30 is a step US that is one level higher. However, the step US is a configuration that occurs due to the patterning; and the electrode film 32 that has the step US as an end surface does not function electrically and is insulated and isolated from the electrode films that actually function. Similarly to the other embodiments, the electrode films that actually function descend, in stages and without increasing partway, in the direction from the central portion 30b toward the end portion 30a. Multiple levels of the terraces that are arranged along the Y-direction may be formed similarly to the terraces arranged along the X-direction.

In the embodiment, the word lines WL and the drain-side selection gates SGD that are arranged along the Y-direction can be formed by the same process; and the number of processes can be reduced.

Otherwise, the configuration and the effects of the embodiment are similar to those of the sixth embodiment described above.

(Eighth Embodiment)

An eighth embodiment will now be described.

Figure 22:
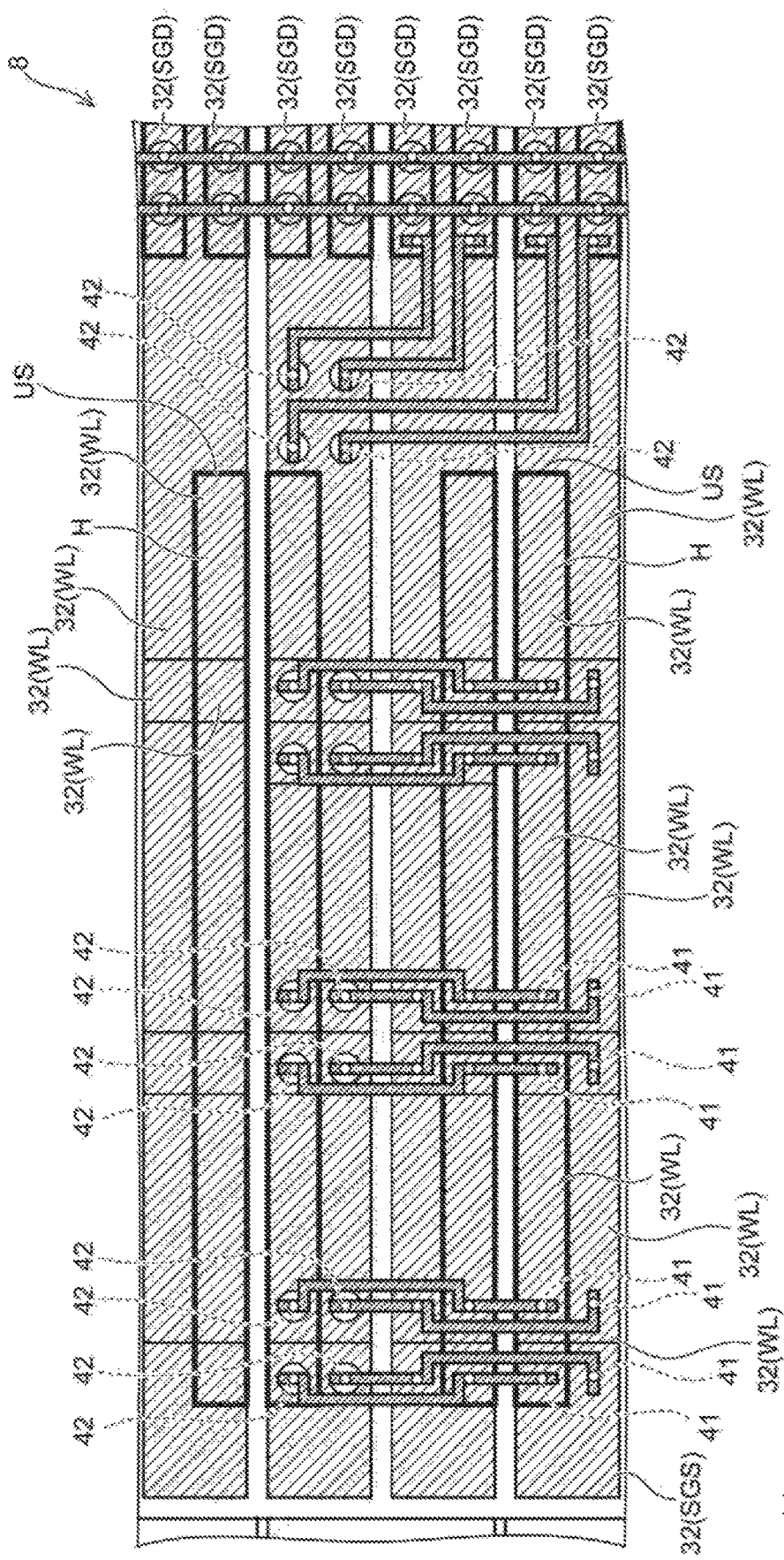
FIG. 22 is a plan view showing a stacked body of a semiconductor memory device according to an eighth embodiment.

FIG. 22 is a plan view showing the stacked body of a semiconductor memory device according to the embodiment.

Figure 23:
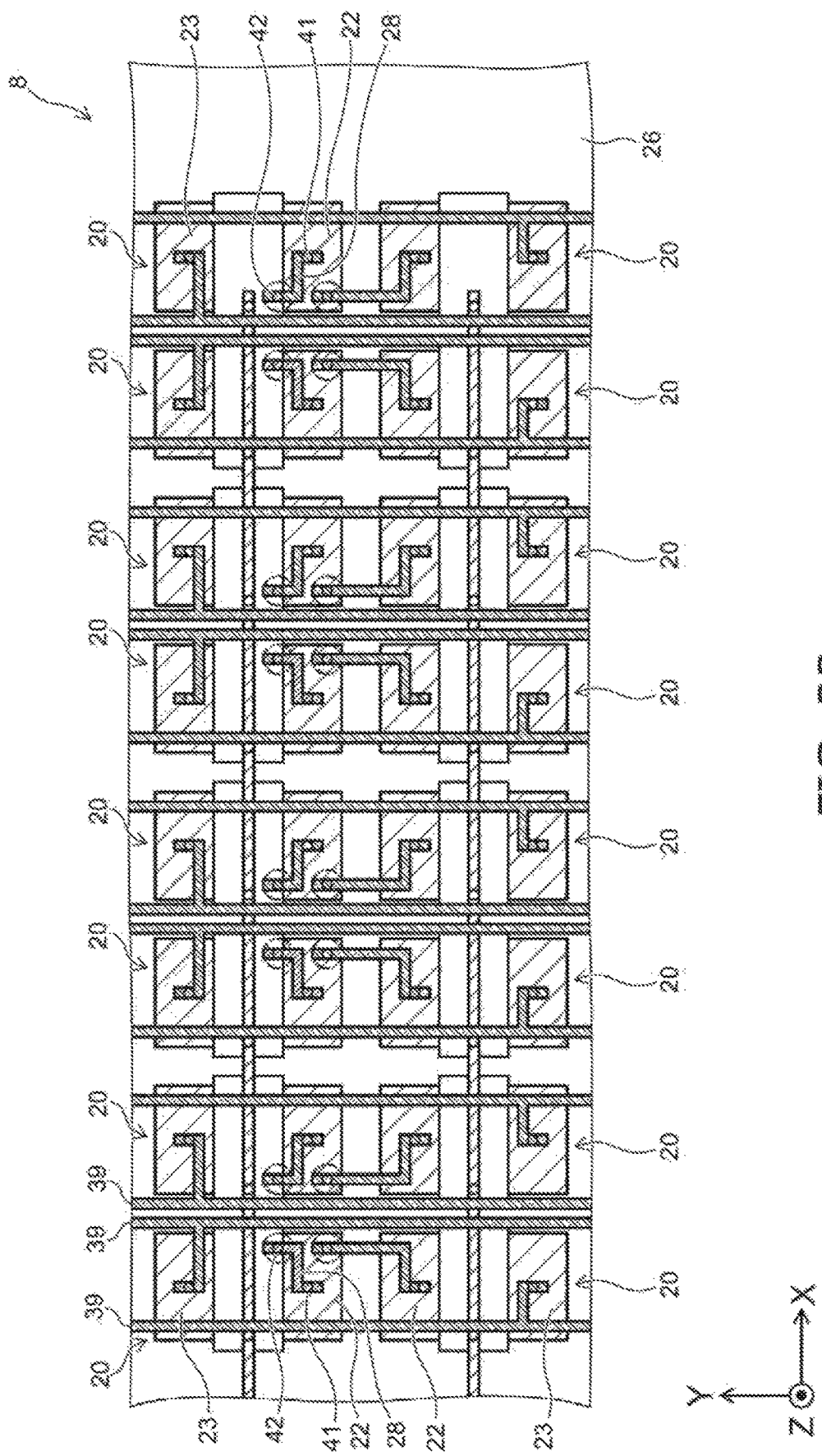
FIG. 23 is a plan view showing a semiconductor substrate of the semiconductor memory device according to the eighth embodiment.

FIG. 23 is a plan view showing the semiconductor substrate of the semiconductor memory device according to the embodiment.

Figure 24:
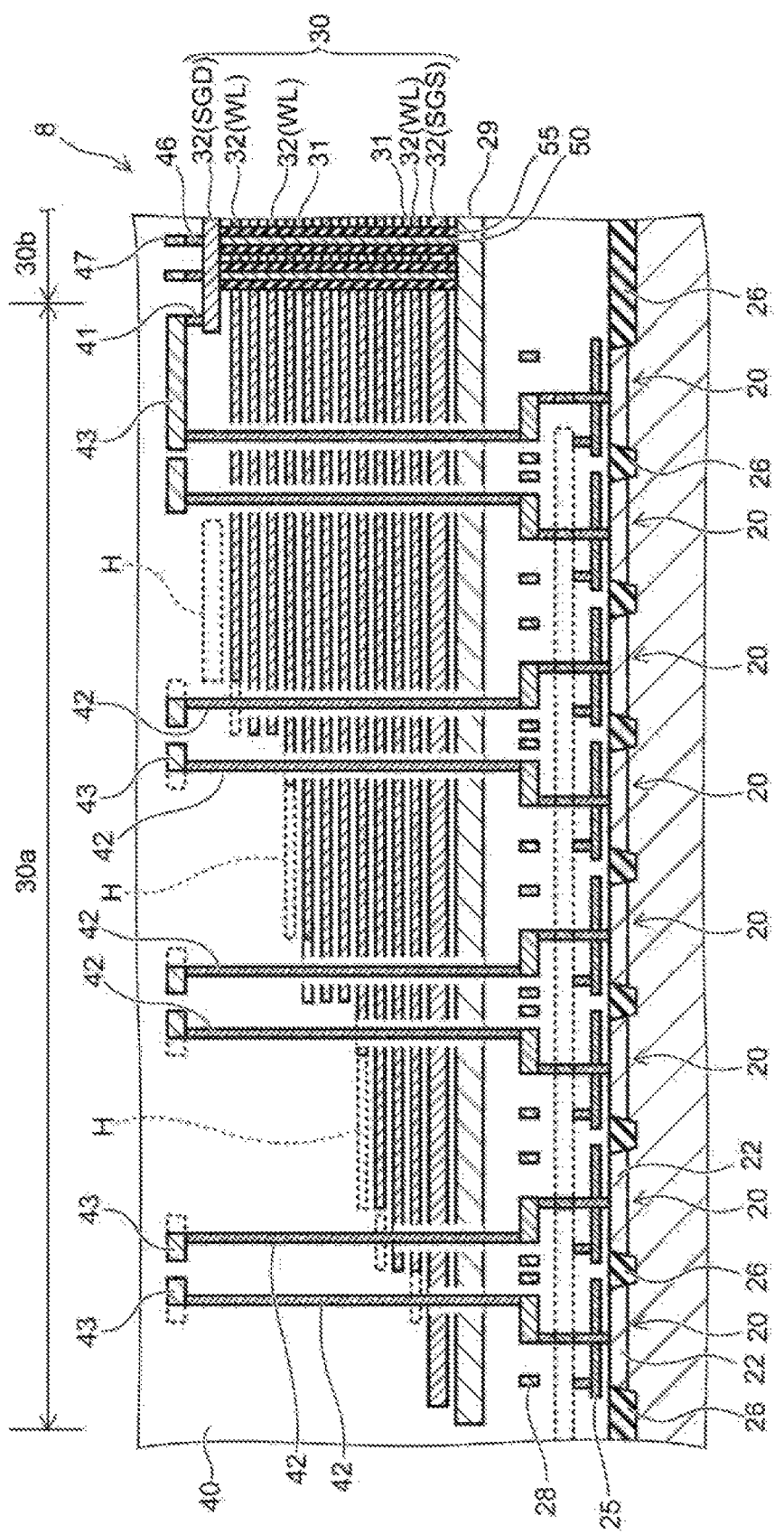
FIG. 24 is a cross-sectional view showing the semiconductor memory device according to the eighth embodiment.

FIG. 24 is a cross-sectional view showing the semiconductor memory device according to the embodiment.

As shown in FIG. 22 to FIG. 24, compared to the semiconductor memory device 6 according to the seventh embodiment described above (referring to FIG. 19 to FIG. 21), the arrangement of the contacts 41 and 42 of the semiconductor memory device 8 according to the embodiment is different.

For each of the source-side selection gates SGS and the word lines WL in the semiconductor memory device 8, the two contacts 41 that are connected to two terraces arranged along the Y-direction and the two contacts 42 connected to these contacts 41 via the upper layer word lines 43 are arranged in one column along the Y-direction. In other words, in the X-direction, the positions of the two contacts 41 and the positions of the two contacts 42 are equal to each other. For the drain-side selection gates SGD, the four contacts 41 that are connected to two terraces arranged along the Y-direction are arranged in one column along the Y-direction; and the four contacts 42 that are connected to these four contacts 41 also are arranged in one column along the Y-direction. In other words, the positions of the four contacts 41 in the X-direction are equal to each other; and the positions of the four contacts 42 also are equal to each other. However, in the X-direction, the positions of the contacts 41 and the positions of the contacts 42 are different from each other.

Otherwise, the configuration and the effects of the embodiment are similar to those of the seventh embodiment described above.

(Ninth Embodiment)

A ninth embodiment will now be described.

Figure 25:
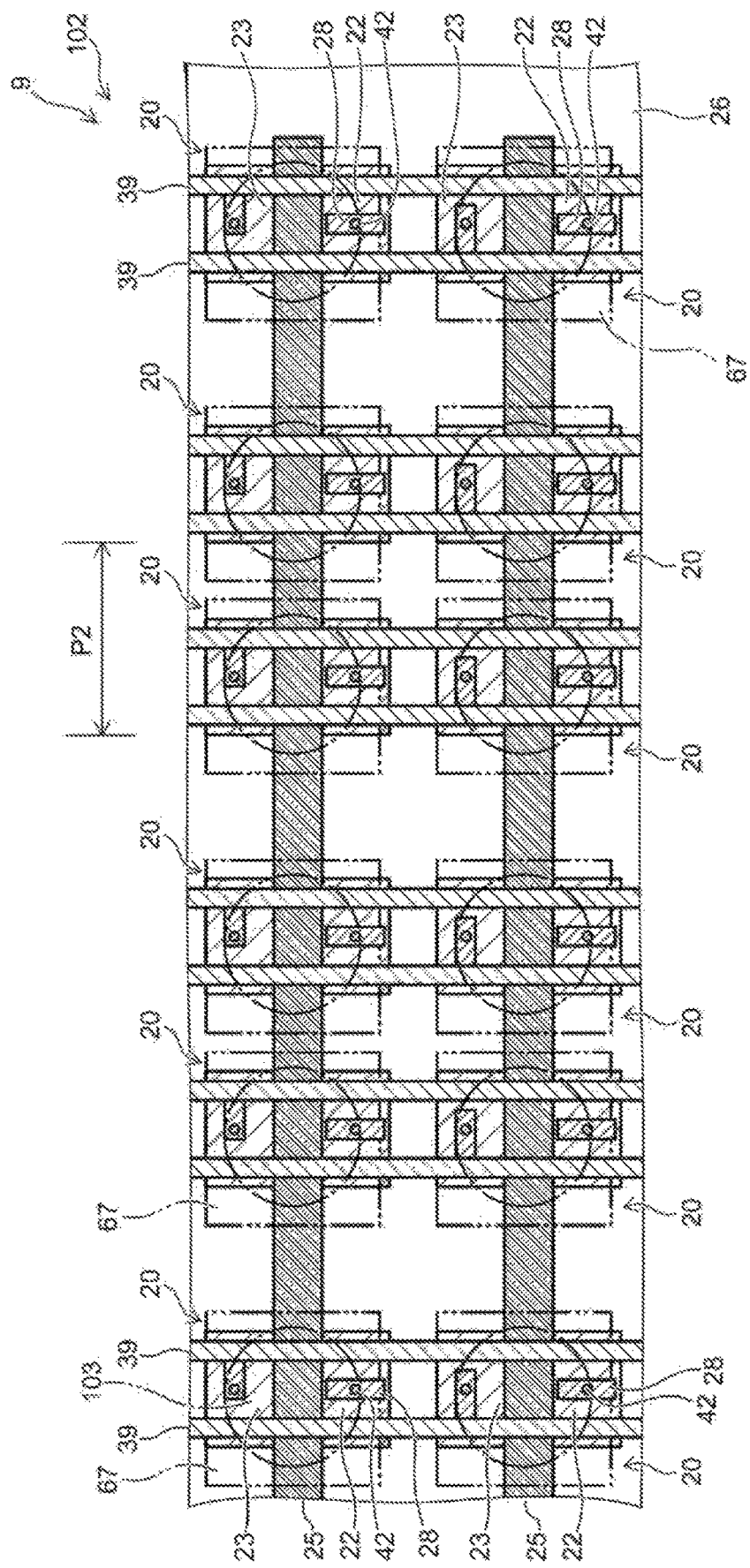
FIG. 25 is a plan view showing a chip in which transistors of a semiconductor memory device according to a ninth embodiment are formed.

FIG. 25 is a plan view showing a chip in which the transistors of the semiconductor memory device according to the embodiment are formed.

Figure 26:
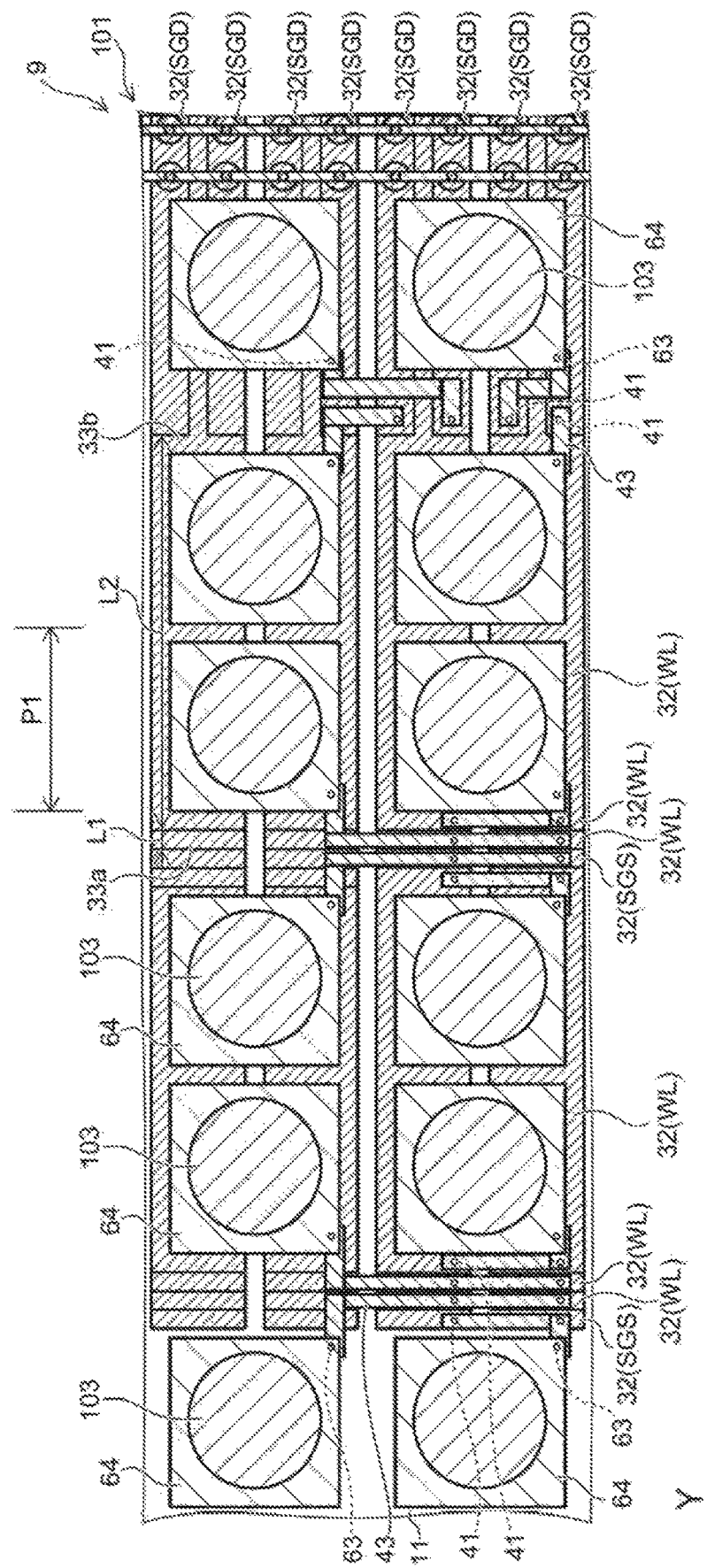
FIG. 26 is a plan view showing a chip in which a stacked body of the semiconductor memory device according to the ninth embodiment is formed.

FIG. 26 is a plan view showing a chip in which the stacked body of the semiconductor memory device according to the embodiment is formed.

Figure 27:
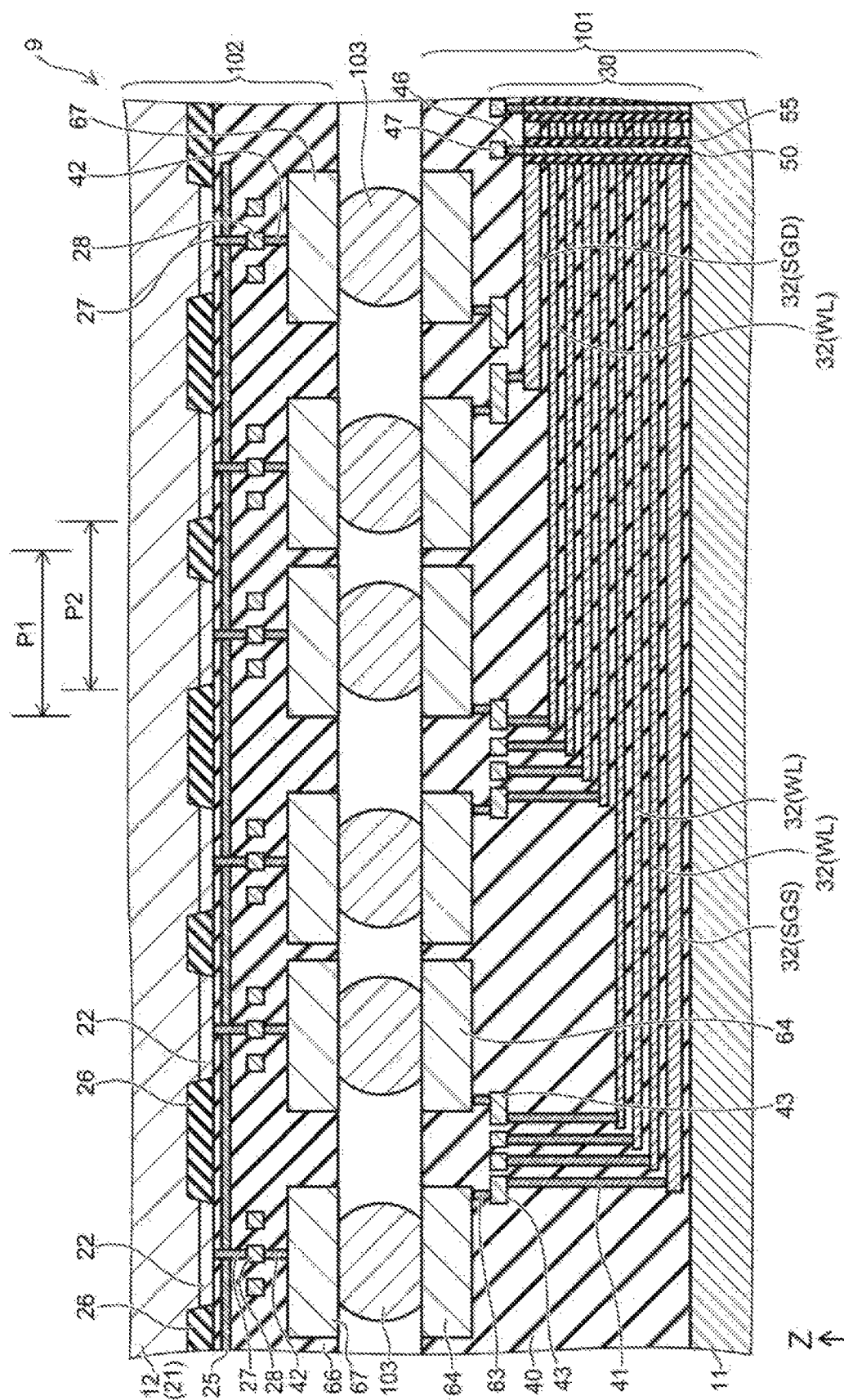
FIG. 27 is a cross-sectional view showing the semiconductor memory device according to the ninth embodiment.

FIG. 27 is a cross-sectional view showing the semiconductor memory device according to the embodiment.

In the semiconductor memory device 9 according to the embodiment as shown in FIG. 25 to FIG. 27, two chips 101 and 102 are bonded with bumps 103 interposed. The stacked body 30 is provided in the chip 101. The transistors 20 are formed in the chip 102. Then, the electrode films 32 that are provided in the chip 101 are connected, with the bumps 103 interposed, to the transistors 20 formed in the chip 102. In the semiconductor memory device 9, the upper surface sides of the chip 102 shown in FIG. 25 and the chip 101 shown in FIG. 26 are bonded to oppose each other. Although FIG. 27 shows the cross section including the centers of the bumps 103, FIG. 27 also shows the lower layer interconnects 28 and the contacts 42 for convenience of description.

This will now be described in more detail.

In the chip 101, a semiconductor substrate 11 that is made of, for example, silicon is provided; the stacked body 30 is provided on the semiconductor substrate 11; and the insulating film 40 is provided to cover the stacked body 30. However, the transistors 20 are not formed in the semiconductor substrate 11; and the source line 29 (referring to FIG. 24) is not provided between the semiconductor substrate 11 and the stacked body 30. Also, the contacts 41 are provided on the terraces of the electrode films 32 of the stacked body 30; the upper layer word lines 43 are provided on the contacts 41; and the upper ends of the contacts 41 are connected to the upper layer word lines 43. However, the contacts 42 (referring to FIG. 24) are not provided. Pads 64 are provided in the upper layer portion of the insulating film 40 and are exposed at the upper surface of the inter-layer 40. The pads 64 are formed of, for example, copper. Contacts 63 are connected between the upper layer word lines 43 and the pads 64.

In the embodiment, similarly to the sixth embodiment described above (referring to FIG. 16 to FIG. 18), the electrode films 32 are drawn out to the two X-direction sides of the stacked body 30. In other words, the multiple source-side selection gates SGS and the multiple word lines WL that are arranged along the Y-direction are drawn out alternately two at a time to the two X-direction sides of the stacked body 30. Also, the multiple drain-side selection gates SGD that are arranged along the Y-direction are drawn out alternately four at a time to the two X-direction sides of the stacked body 30.

Also, two source-side selection gates SGS that are adjacent to each other in the Y-direction are connected to a common upper layer word line 43 via the contacts 41 and are connected to one pad 64 via one contact 63. Also, two word lines WL that are adjacent to each other in the Y-direction are connected to a common upper layer word line 43 via the contacts 41 and are connected to one pad 64 via one contact 63. However, the word lines WL that have mutually-different positions in the Z-direction are connected to mutually-different upper layer word lines 43. Further, four drain-side selection gates SGD that are arranged along the Y-direction are connected to mutually-different pads 64 via the contacts 41, the upper layer word lines 43, and the contacts 63. Thus, each of the electrode films 32 is connected to some pad 64 via the contact 41, the upper layer word line 43, and the contact 63.

On the other hand, in the chip 102, a semiconductor substrate 12 that is made of, for example, silicon is provided; and an inter-layer insulating film 66 is provided on the semiconductor substrate 12. The transistors 20 are formed inside the upper layer portion of the semiconductor substrate 12 and inside the inter-layer insulating film 66 and are arranged in a matrix configuration along the X-direction and the Y-direction. In the chip 102, two transistors 20 arranged in the X direction constitute one group, and this group is periodically arranged in the X direction. Also in such a case, it is assumed that the transistors 20 are periodically arranged, and the arrangement period of the transistors 20 in each group is set as the minimum arrangement period of the transistor 20. The configuration of the transistor 20 is similar to that of the first embodiment described above. Pads 67 are provided in the upper layer portion of the inter-layer insulating film 66. The pads 67 are formed of, for example, copper. The contacts 42 are connected between the pads 67 and the lower layer interconnects 28. Thus, the diffusion region 22 of each of the transistors 20 is connected to some pad 67 via the contact 27, the lower layer interconnect 28, and the contact 42.

The chip 101 and the chip 102 are arranged so that the pads 64 and the pads 67 oppose each other; and the bumps 103 are bonded between the pads 64 and the pads 67. The bumps 103 are bumps made of a conductive material and are, for example, solder balls. By the bumps 103, the pads 64 are electrically connected to the pads 67; and the chip 101 is mechanically linked to the chip 102. Thereby, the electrode films 32 of the chip 101 are connected to the diffusion regions 22 of the transistors 20 of the chip 102.

The length of a terrace T in the X-direction is determined by a period P=MAX(P1, P2) which is the greater of a period P1 and a period P2, where P1 is the minimum arrangement period of the pads 64 in the X-direction, and P2 is the minimum arrangement period of the transistors 20 in the X-direction. The length L1 of the terrace 33a disposed in the region R1 is shorter than the period P. Also, the length L2 of the terrace 33b disposed in the region R2 is longer than the period P. In other words, L1<P<L2.

Effects of the embodiment will now be described.

In the embodiment, the two chips 101 and 102 are provided; the stacked body 30 is formed in the chip 101; and the transistors 20 are formed in the chip 102. Thereby, compared to the case where both the stacked body 30 and the transistors 20 are formed in one chip, the manufacturing is easy; and the manufacturing cost is low.

Also, the layout of the upper layer word lines 43 can be simplified because it is unnecessary to provide the contacts 42 inside the chip 101. Thereby, the layout of the upper layer word lines 43 is made easily; and the decrease of the operation speed due to the downscaling of the interconnects, the increase of the power consumption, and the decrease of the reliability can be suppressed.

Otherwise, the configuration and the effects of the embodiment are similar to those of the first embodiment described above.

(First Modification of Ninth Embodiment)

A first modification of the ninth embodiment will now be described.

Figure 28:
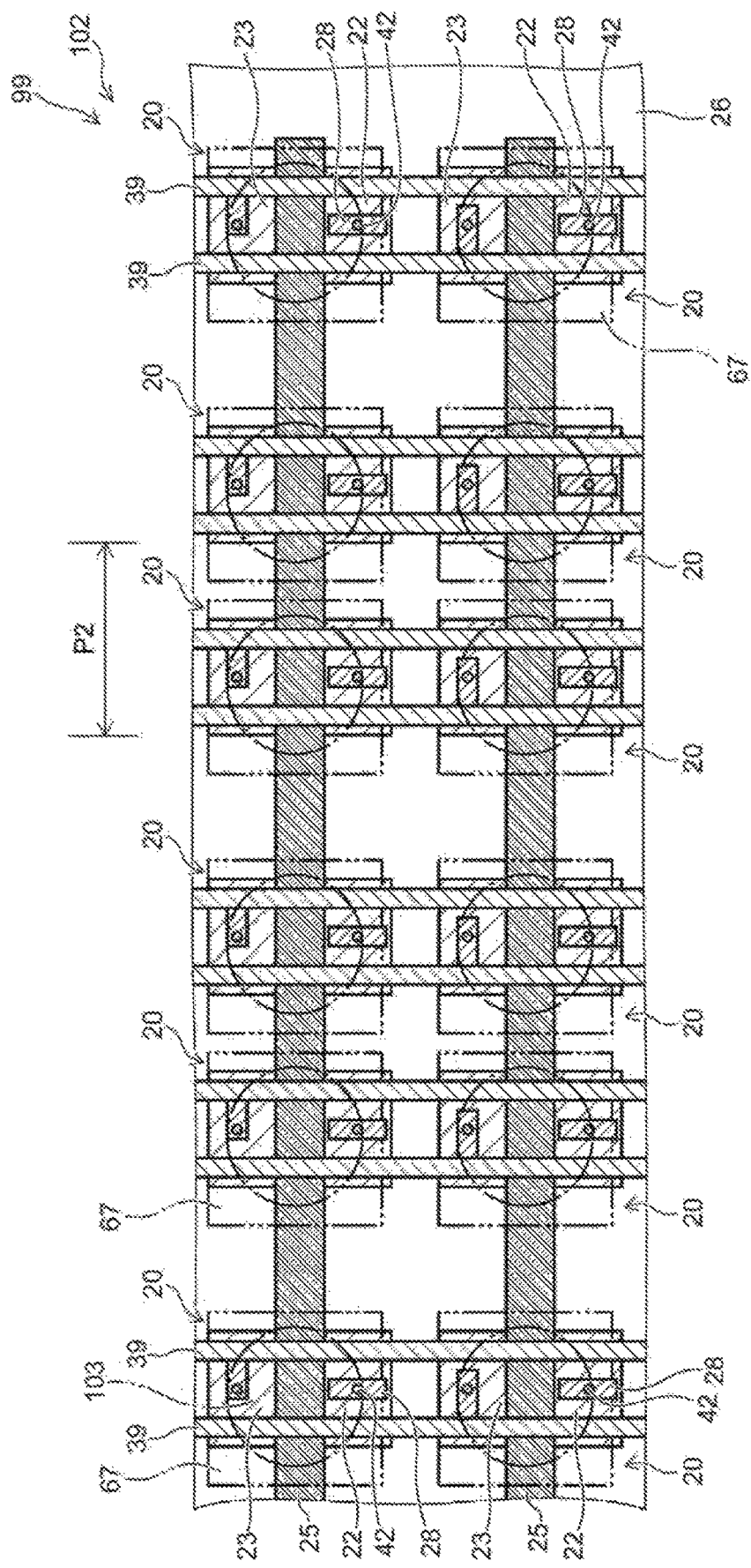
FIG. 28 is a plan view showing a chip in which transistors of a semiconductor memory device according to a first modification of the ninth embodiment are formed.

FIG. 28 is a plan view showing a chip in which the transistors of a semiconductor memory device according to the modification are formed.

Figure 29:
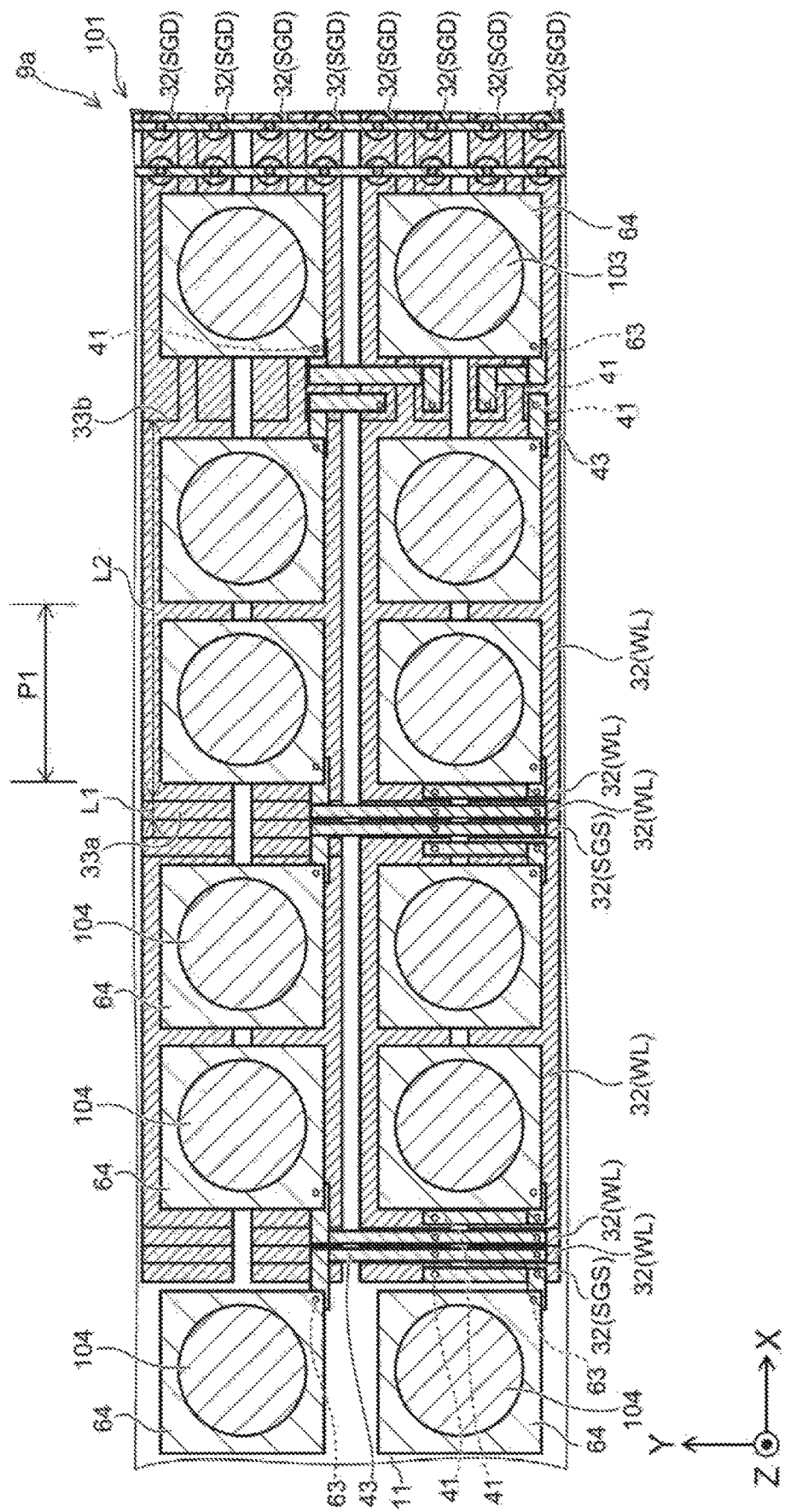
FIG. 29 is a plan view showing a chip in which a stacked body of the semiconductor memory device according to the first modification of the ninth embodiment is formed.

FIG. 29 is a plan view showing a chip in which the stacked body of the semiconductor memory device according to the modification is formed.

Figure 30:
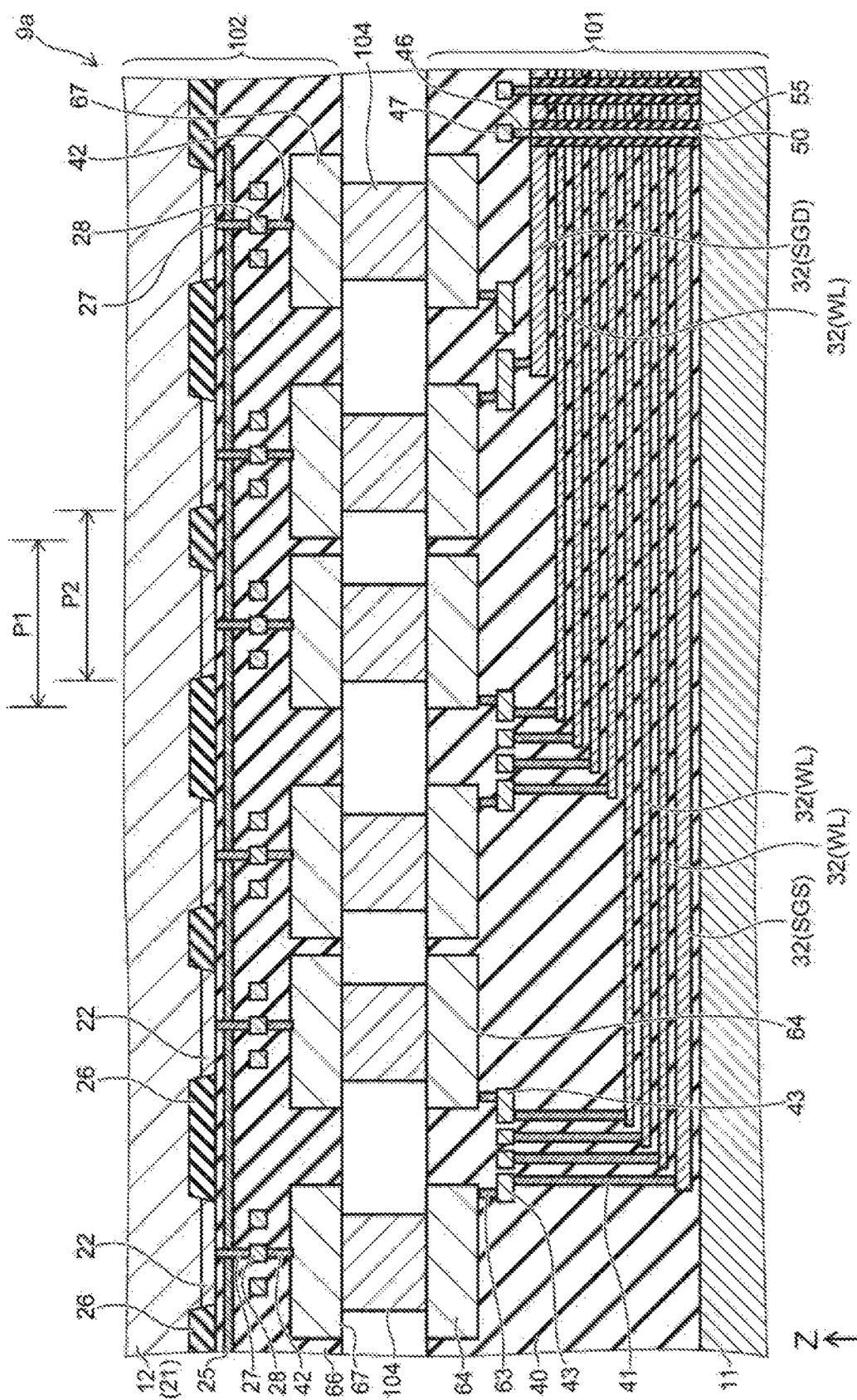
FIG. 30 is a cross-sectional view showing the semiconductor memory device according to the first modification of the ninth embodiment.

FIG. 30 is a cross-sectional view showing the semiconductor memory device according to the modification.

In the semiconductor memory device 9a according to the modification as shown in FIG. 28 to FIG. 30, the chip 101 and the chip 102 are bonded by conductive pillars 104. The pillars 104 are made from, for example, copper; and the configurations of the pillars 104 are, for example, circular columns. The configurations of the chip 101 and the chip 102 are similar to those of the ninth embodiment described above.

Otherwise, the configuration and the effects of the modification are similar to those of the ninth embodiment described above.

(Second Modification of Ninth Embodiment)

A second modification of the ninth embodiment will now be described.

Figure 31:
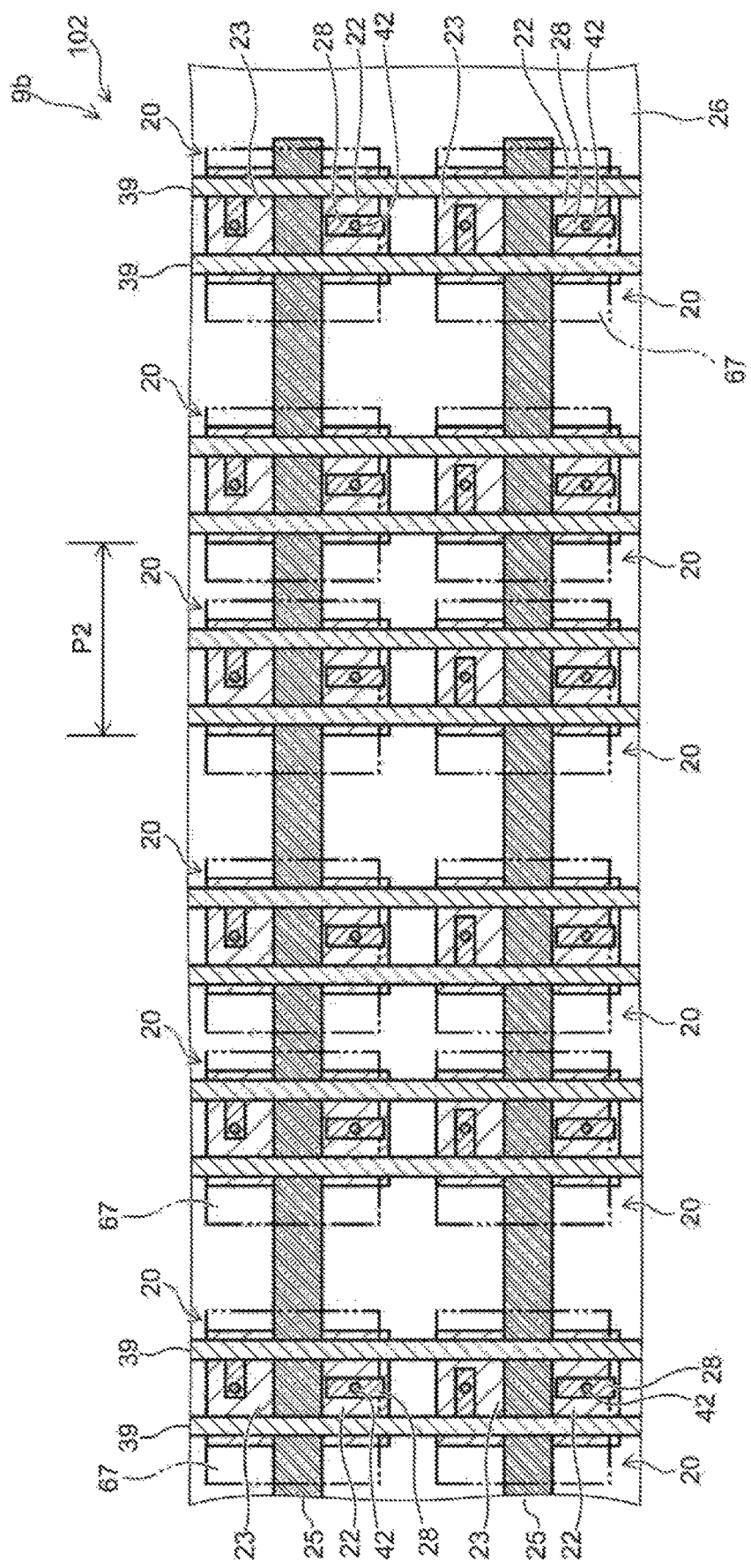
FIG. 31 is a plan view showing a chip in which transistors of a semiconductor memory device according to a second modification of the ninth embodiment are formed.

FIG. 31 is a plan view showing a chip in which the transistors of a semiconductor memory device according to the modification are formed.

Figure 32:
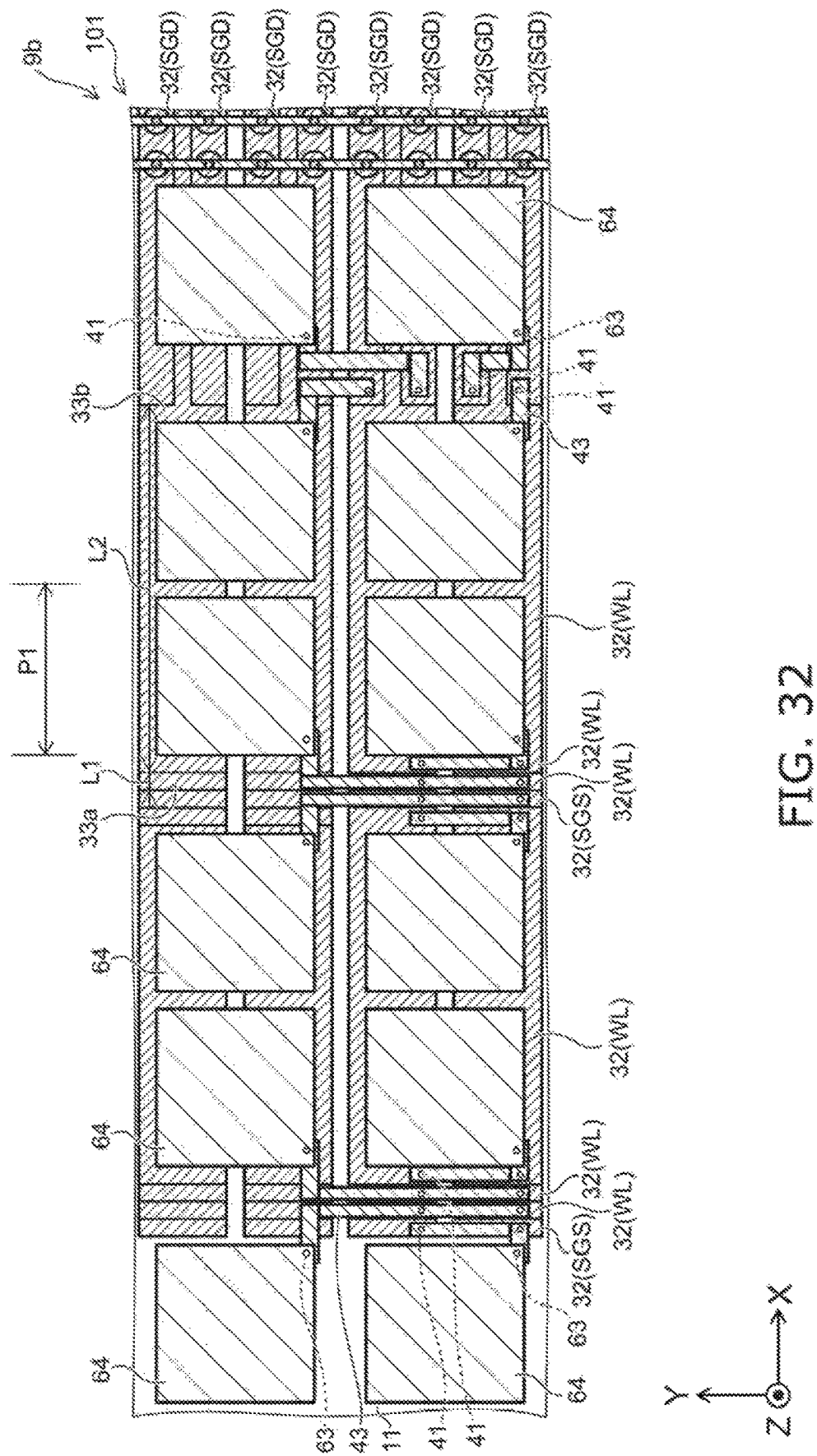
FIG. 32 is a plan view showing a chip in which a stacked body of the semiconductor memory device according to the second modification of the ninth embodiment is formed.

FIG. 32 is a plan view showing a chip in which the stacked body of the semiconductor memory device according to the modification is formed.

Figure 33:
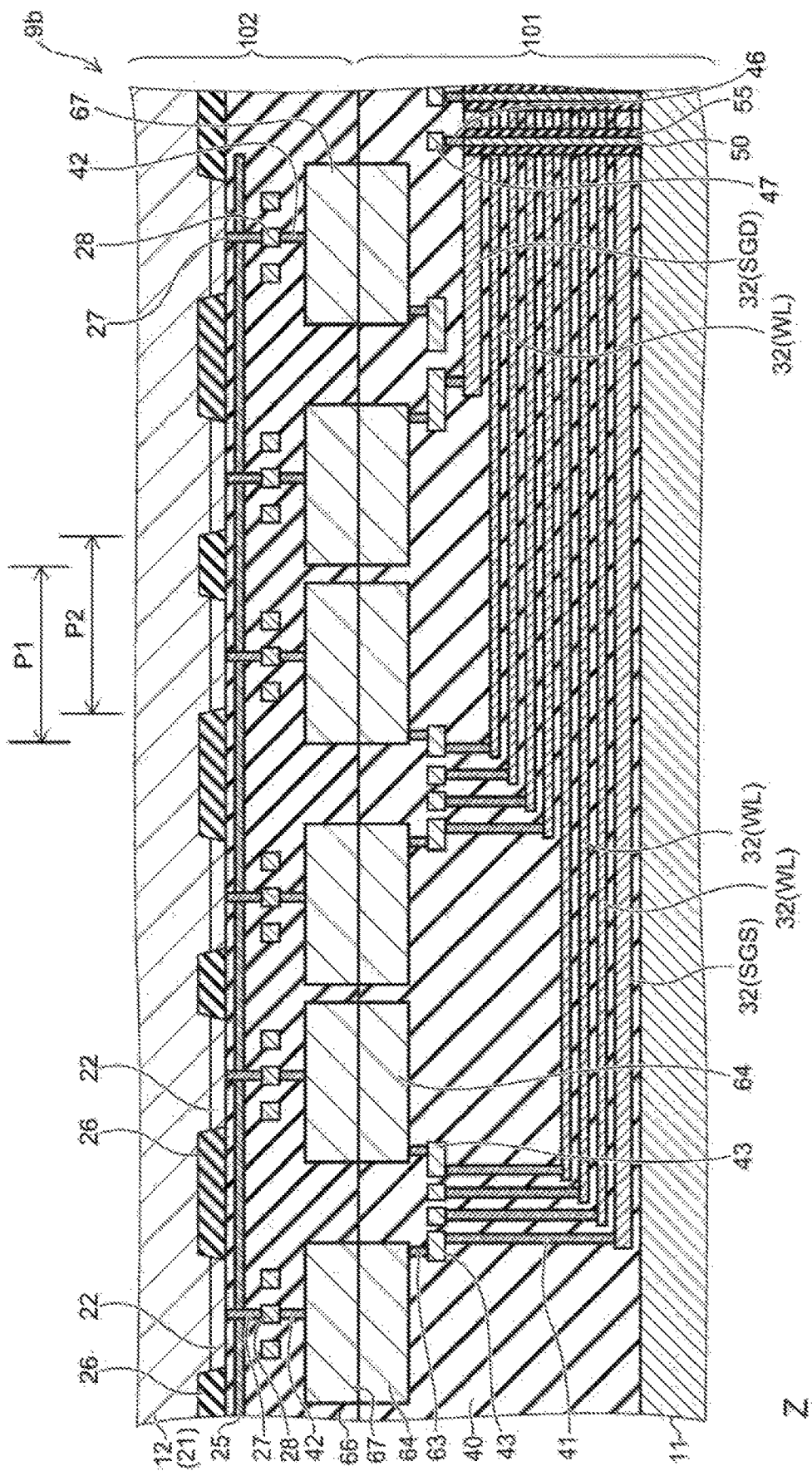
FIG. 33 is a cross-sectional view showing the semiconductor memory device according to the second modification of the ninth embodiment.

FIG. 33 is a cross-sectional view showing the semiconductor memory device according to the modification.

As shown in FIG. 31 to FIG. 33, the chip 101 and the chip 102 are directly bonded in the semiconductor memory device 9b according to the modification. For example, the chip 101 is linked to the chip 102 by a bonding agent or mechanical method; and the pads 64 of the chip 101 contact the pads 67 of the chip 102. The pads 64 and the pads 67 may be bonded by a conductive bonding agent. The configurations of the chip 101 and the chip 102 are similar to those of the ninth embodiment described above.

Otherwise, the configuration and the effects of the modification are similar to those of the ninth embodiment described above.

According to the embodiments and the modifications of the embodiments described above, a semiconductor memory device can be realized in which the layout of the interconnects is easy.

The staircase along the Y-direction also may be formed in the end portion 30a of the stacked body 30 of the first, third, fourth, and ninth embodiments and the first and second modifications of the ninth embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments and the modifications described above can be combined mutually.

What is claimed is:

1. A semiconductor memory device, comprising:
a first chip; and
a second chip,
the first chip including
    a first semiconductor substrate having a first main surface extending in a first direction and a second direction, the second direction crossing the first direction,
    a stacked body provided on the first semiconductor substrate, the stacked body including a plurality of electrode films stacked to be separated from each other along a third direction, the third direction crossing the first direction and the second direction,
    a semiconductor member piercing the plurality of electrode films in the third direction,
    a charge storage member provided between the semiconductor member and one of the plurality of electrode films,
    a first pad, and
    a first contact connecting the one of the plurality of electrode films to the first pad, and
the second chip including
    a second semiconductor substrate having a second main surface extending in the first direction and the second direction,
    a plurality of transistors formed in the second main surface,
    a second pad, and
    a second contact connecting one of a source/drain of one of the transistors to the second pad, wherein
the first chip and the second chip face each other such that the first pad is connected to the second pad,
a configuration of an end portion in the first direction of the stacked body is staircase-like having a plurality of terraces, each of the plurality of terraces being formed each of electrode films and the plurality of terraces including a plurality of first terraces and a second terrace, a second region and two first regions along the first direction are set in the end portion, the second region being disposed between the two first regions, the plurality of first terraces is disposed in each of the first regions, the second terrace is disposed in the second region, a length in the first direction of the second terrace is longer than the larger period of a minimum period in the first direction of the first pads and a minimum period in the first direction of the plurality of transistors, and a length in the first direction of one of the plurality of first terraces disposed in the first region is shorter than the larger period.

2. The device according to claim 1, further comprising a bump connected between the first pad and the second pad.

3. The device according to claim 1, further comprising a pillar connected between the first pad and the second pad, the pillar being conductive.

4. The device according to claim 1, wherein the first pad contacts the second pad.

5. The device according to claim 1, wherein the first chip further includes a bit line connected to an end in the third direction of the semiconductor member, the bit line extending in the second direction.

6. The device according to claim 1, wherein the first chip further includes a first insulating film formed to cover the first main surface of the first semiconductor substrate, the first pad being exposed from the first insulating film, and the second chip further includes a second insulating film formed to cover the second main surface of the second semiconductor substrate, the second pad being exposed from the second insulating film.

7. The device according to claim 1, wherein in the first chip, the first contact is provided in plurality correspondingly with the electrode films, and the first pad is provided in plurality correspondingly with the first contacts, and in the second chip, the second contact is provided in plurality correspondingly with the transistors, and the second pad is provided in plurality correspondingly with the second contacts.

8. The device according to claim 7, wherein the first pads are arranged in an array manner when viewed in the third direction, and the second pads are arranged in an array manner when viewed in the third direction.

9. The device according to claim 1, wherein the one of the plurality of electrode films is subdivided into a plurality of band-like portions arranged along the second direction, and the first contact is connected to a first band-like portion of the plurality of band-like portions.

10. The device according to claim 1, wherein the stacked body is subdivided into a plurality of band-like portions arranged along the second direction, and a slit is formed between the band-like portions.

11. The device according to claim 1, wherein the plurality of transistors are arranged along the second direction.

12. The device according to claim 1, wherein the one of the plurality of electrode films is subdivided into a plurality of band-like portions arranged along the second direction, and the plurality of band-like portions is connected to the same transistor.

13. The device according to claim 1, wherein the one of the plurality of electrode films is subdivided into a plurality of band-like portions arranged along the second direction, and the first contact is connected to some of the band-like portions.

14. The device according to claim 13, wherein the first contact is connected to a mutually-adjacent plurality of the band-like portions and is not connected to another mutually-adjacent plurality of the band-like portions.

15. The device according to claim 1, wherein the charge storage member includes silicon and nitrogen.

16. The device according to claim 1, wherein the charge storage member is conductive.

* * * * *